United States Patent
Yang et al.

(10) Patent No.: US 7,211,143 B2
(45) Date of Patent: May 1, 2007

(54) SACRIFICIAL TEMPLATE METHOD OF FABRICATING A NANOTUBE

(75) Inventors: Peidong Yang, Berkeley, CA (US); Rongrui He, Berkeley, CA (US); Joshua Goldberger, Berkeley, CA (US); Rong Fan, El Cerrito, CA (US); Yi-Ying Wu, Albany, CA (US); Deyu Li, Albany, CA (US); Arun Majumdar, Orinda, CA (US)

(73) Assignee: The Regents of the University of California, Oakland, CA (US)

( * ) Notice: Subject to any disclaimer, the term of this patent is extended or adjusted under 35 U.S.C. 154(b) by 65 days.

(21) Appl. No.: 10/731,745

(22) Filed: Dec. 8, 2003

(65) Prior Publication Data

US 2004/0175844 A1    Sep. 9, 2004

Related U.S. Application Data

(60) Provisional application No. 60/461,346, filed on Apr. 8, 2003, provisional application No. 60/454,038, filed on Mar. 11, 2003, provisional application No. 60/432,104, filed on Dec. 9, 2002.

(51) Int. Cl.
*C30B 23/00* (2006.01)
*C30B 25/00* (2006.01)
*C30B 28/12* (2006.01)

(52) U.S. Cl. .............. 117/84; 117/87; 117/88; 117/106; 117/920; 977/734; 977/742; 977/762; 977/855

(58) Field of Classification Search .............. 117/84, 117/87, 88, 106, 920
See application file for complete search history.

(56) References Cited

U.S. PATENT DOCUMENTS 5,352,512 A * 10/1994 Hoffman ............ 428/311.51
6,123,819 A * 9/2000 Peeters ................ 204/452
6,194,066 B1 * 2/2001 Hoffman ............... 428/367
6,221,154 B1 * 4/2001 Lee et al. ................ 117/87
6,413,880 B1 * 7/2002 Baski et al. ............. 438/759
6,656,573 B2 * 12/2003 Chen et al. .............. 117/105
6,962,823 B2 * 11/2005 Empedocles et al. ........ 438/3

(Continued)

OTHER PUBLICATIONS

Empedocles et. al. U.S. Appl. No. 60/370,113, filed Apr. 2, 2002.*

*Primary Examiner*—Robert B. Davis
*Assistant Examiner*—G. Nagesh Rao
(74) *Attorney, Agent, or Firm*—John P. O'Banion

(57) ABSTRACT

Methods of fabricating uniform nanotubes are described in which nanotubes were synthesized as sheaths over nanowire templates, such as using a chemical vapor deposition process. For example, single-crystalline zinc oxide (ZnO) nanowires are utilized as templates over which gallium nitride (GaN) is epitaxially grown. The ZnO templates are then removed, such as by thermal reduction and evaporation. The completed single-crystalline GaN nanotubes preferably have inner diameters ranging from 30 nm to 200 nm, and wall thicknesses between 5 and 50 nm. Transmission electron microscopy studies show that the resultant nanotubes are single-crystalline with a wurtzite structure, and are oriented along the <001> direction. The present invention exemplifies single-crystalline nanotubes of materials with a non-layered crystal structure. Similar "epitaxial-casting" approaches could be used to produce arrays and single-crystalline nanotubes of other solid materials and semiconductors. Furthermore, the fabrication of multi-sheath nanotubes are described as well as nanotubes having multiple longitudinal segments.

34 Claims, 19 Drawing Sheets

GaN/ZnO
Core-sheath
Structure

ZnO
Template
Removal

U.S. PATENT DOCUMENTS

| | | |
|---|---|---|
| 2002/0117659 A1* | 8/2002 | Lieber et al. .................. 257/14 |
| 2002/0130311 A1* | 9/2002 | Lieber et al. .................. 257/1 |
| 2002/0175408 A1 | 11/2002 | Majumdar et al. |
| 2003/0165418 A1* | 9/2003 | Ajayan et al. ............ 423/447.2 |
| 2004/0005723 A1* | 1/2004 | Empedocles et al. .......... 438/1 |
| 2004/0175844 A1 | 9/2004 | Yang et al. |
| 2004/0262636 A1* | 12/2004 | Yang et al. .................. 257/200 |
| 2005/0024433 A1* | 2/2005 | Cruz-Uribe et al. .......... 347/50 |
| 2005/0036939 A1* | 2/2005 | Wong et al. ................. 423/598 |
| 2005/0053525 A1* | 3/2005 | Segal et al. .................... 422/88 |
| 2005/0056118 A1* | 3/2005 | Xia et al. ..................... 75/330 |
| 2005/0101020 A1* | 5/2005 | Salem et al. ................. 435/459 |

* cited by examiner

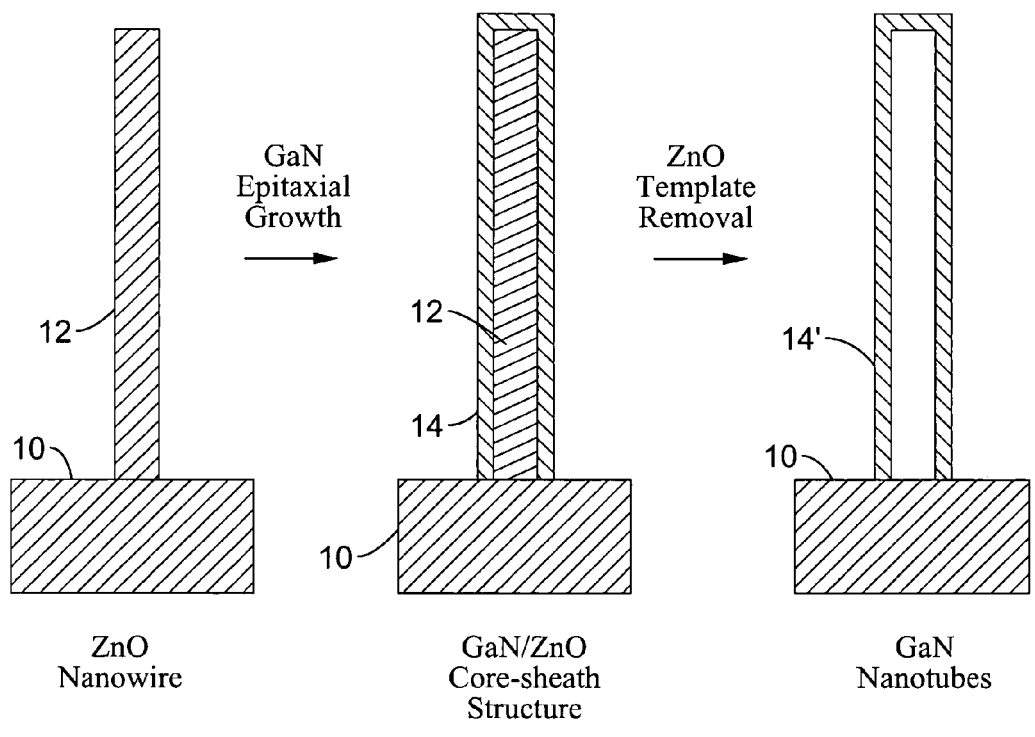
FIG. 1A — ZnO Nanowire
FIG. 1B — GaN/ZnO Core-sheath Structure
FIG. 1C — GaN Nanotubes

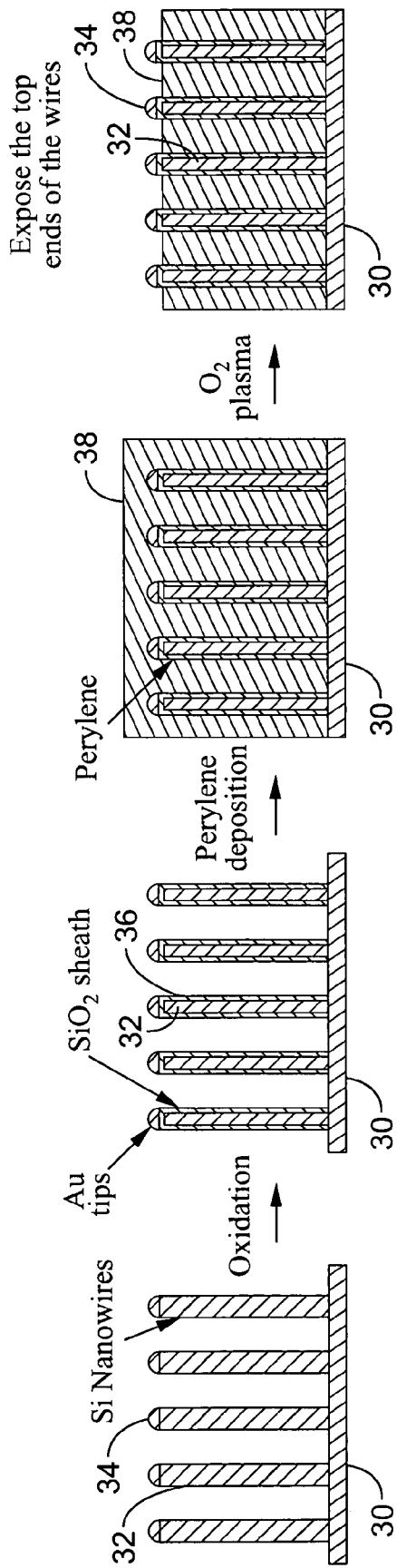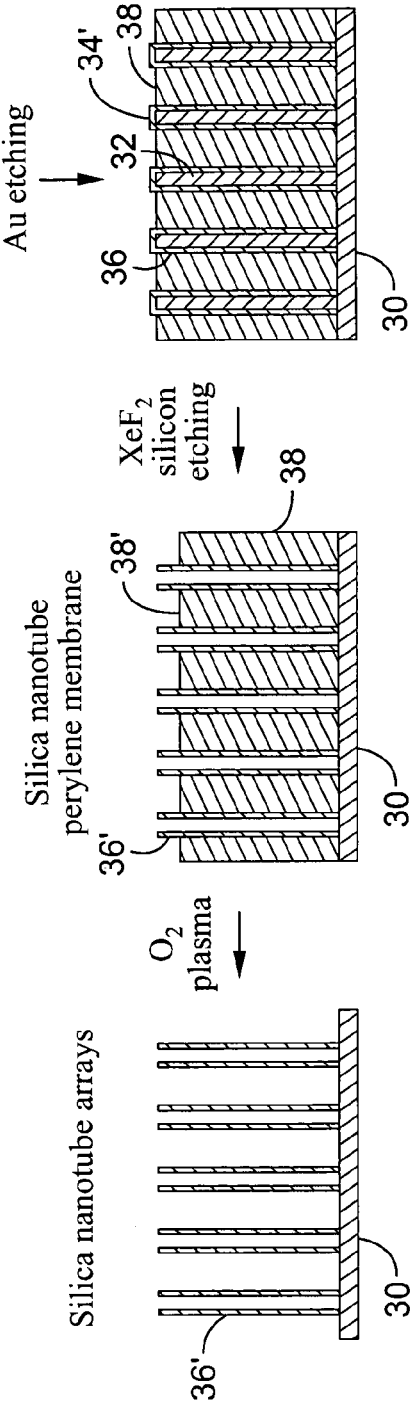

SACRIFICIAL TEMPLATE METHOD OF FABRICATING A NANOTUBE

CROSS-REFERENCE TO RELATED APPLICATIONS

This application claims priority from U.S. provisional application Ser. No. 60/461,346 filed on Apr. 8, 2003, incorporated herein by reference in its entirety.

This application claims priority from U.S. provisional application Ser. No. 60/454,038 filed on Mar. 11, 2003, incorporated herein by reference in its entirety.

This application claims priority from U.S. provisional application serial No. 60/432,104 filed on Dec. 9, 2002, incorporated herein by reference in its entirety.

STATEMENT REGARDING FEDERALLY SPONSORED RESEARCH OR DEVELOPMENT

This invention was made with Government support under Contract No. DE-AC03-76SF00098, awarded by the Department of Energy and Grant No. DMR-0092086, awarded by the National Science Foundation. The Government has certain rights in this invention.

INCORPORATION-BY-REFERENCE OF MATERIAL SUBMITTED ON A COMPACT DISC

Not Applicable

BACKGROUND OF THE INVENTION

1. Field of the Invention

This invention pertains generally to fabricating nanotubes, and more particularly to a method of fabricating a nanotube over a sacrificial nanowire template.

2. Description of Related Art

Since the discovery of carbon nanotubes (see Iijima, S., Helical microtubules of graphitic carbon, *Nature*, 354, 56 (1991), incorporated herein by reference), there have been significant research efforts devoted to nanoscale tubular forms of various solids (see Tenne, R. & Zettl, A. K., Nanotubes from inorganic materials, *Top. Appl. Phys.* 80, 81–112 (2001); Tenne, R., Inorganic nanoclusters with fluorine-like structure and nanotubes, *Prig. Inure. Chem.* 50,269–315 (2001); Partake, G. R., Cromlech, F. & Nester, R., Oxidic nanotubes and nanorods—Anisotropic modules for a future nanotechnology, *Angew. Chem. Int. Ed.* 41, 2446–2461 (2002); Martin, C. R., Nanomaterials—a membrane-based synthetic approach, *Science*, 266, 1961–65 (1994); Ajayan, P. M. et al., Carbon nanotubes as removable templates for metal-oxide nanocomposites and nanostructures, *Nature*, 375, 564–566 (1996); Yang S. M. et al., Formation of hollow helicoids in mesoporous silica: Supramolecular Origami, *Adv. Mater.* 11,1427–30 (1999); Kondo, Y. & Takanayagi, K., Synthesis and characterization of helical multi-shell gold nanowires, *Science*, 289, 606–608 (2000); Li Y. et al., Bismuth nanotubes, *J. Am. Chem. Soc.* 123, 9904–05 (2001); and Wu, Y. & Yang, P., Melting and welding semiconductor nanowires in nanotubes, *Adv. Mater.* 13, 520–523 (2001), the above references being incorporated herein by reference).

The formation of tubular nanostructures generally requires a layered or anisotropic crystal structure (see Tenne, R. & Zettl, A. K., Nanotubes from inorganic materials, *Top. Appl. Phys.* 80, 81–112 (2001); Tenne, R., Inorganic nanoclusters with fluorine-like structure and nanotubes, *Prig. Inure. Chem.* 50, 269–315 (2001); Partake, G. R., Cromlech, F. & Nester, R., Oxidic nanotubes and nanorods—Anisotropic modules for a future nanotechnology, *Angew. Chem. Int. Ed.* 41, 2446–2461 (2002), the preceding references incorporated herein by reference).

There are reports of nanotube formation of solids lacking layered crystal structures, such as silica, alumina, silicon and metals through templating of carbon nanotubes and porous membranes or thin film rolling Schmidt, O. G. & Eberl, K., Thin solid films roll up into nanotubes, *Nature*, 410, 168 (2001), incorporated herein by reference).

The nanotubes produced by the above methods, however, are either amorphous, polycrystalline, or they exist only in ultra-high vacuum environments.

The significance of hollow inorganic nanotubes is being recognized and they have wide applicability in bioanalysis and catalysis (see Lee, S. B.; Mitcell, D. T.; Trofin, L.; Nevanen, T. K.; Soderlund, H.; Martin, C. R. Science 2002, 296, 2198, incorporated herein by reference). Among these hollow nanotubes silica nanotubes are of special interest because of their hydrophilic nature, colloidal suspension formation, and surface functionalization accessibility for both inner and outer walls. These modified silica nanotubes and nanotube membranes for example have applicability for bioseparation and biocatalysis (see Mitchell, D. T.; Lee, S. B.; Trofin, L.; Li, N. C.; Nevanen, T. K.; Soderlund, H.; Martin, C. R. J. Am. Chem. Soc. 2002, 124, 11864, incorporated herein by reference).

Recently, bright visible photoluminescence from sol-gel template synthesized silica nanotubes was observed by Zhang et al. (see Zhang, M.; Ciocan, E.; Bando, Y.; Wada, K.; Cheng, L. L.; Pirouz, P. Appl. Phys. Lett. 2002, 80, 491; incorporated herein by reference). In addition, the study of the physical and chemical nature of molecules or ions confined within the inorganic nanotubes is of great current interest.

Silica nanotubes have been synthesized typically within the pores of porous alumina membrane templates using the sol-gel coating technique (see Martin, C. R. Chem. Mater. 1996, 8, 1739, incorporated herein by reference). Alumina templates can be dissolved to liberate single silica nanotubes. These nanotubes prepared at low temperature have porous walls and are relatively fragile. Once the templates are removed, the silica nanotubes will generally bundle up and become less oriented. The same applies to the silica nanotubes prepared at low temperature using other templates (see Obare, S. O.; Jana, N. R.; Murphy, C. J. Nano Lett. 2001, 1, 601; Jung, J. H.; Shinkai, S.; Shimizu, T. Nano Lett. 2002, 2, 17; Yin, Y. D.; Lu, Y.; Sun, Y. G.; Xia, Y. N. Nano Left. 2002, 2, 427, incorporated herein by reference).

Accordingly, the growth of single-crystalline semiconductor nanotubes provides a number of advantages for nanoscale electronics, optoelectronics, and biochemical sensing applications. The present invention satisfies those needs, as well as others, and overcomes the deficiencies of previously developed nanoscale growth methods.

BRIEF SUMMARY OF THE INVENTION

The present invention comprises single and multiple layer nanotube structures and methods of fabrication. In the case of multilayered nanotube structures, the interface between cylindrical layers of the nanotubes in the structure may form insulated or non-insulated device junctions, or provide other material properties. In addition, longitudinal portions (segments) of the nanotube may be processed differently to yield longitudinal junctions along a given nanotube.

A key aspect of the present invention is that the nanotubes and composite structures are formed over a sacrificial template which is preferably a nanowire core. The general fabrication process of the present invention involves creating a core (nanotube template), over which a sheath is formed. Numerous methods may be utilized for creating both the core and forming one or more sheaths. It will be appreciated that the core and sheath sections may be formed from a variety of materials.

The core, for example, may be selected from material comprising ZnO, Si, GaN, Ge, Ag, group II–VI materials, group III–V materials, elemental group IV materials (i.e. Si, Ge), and metals. The groupings are considered to describe material groups as shown on a periodic table of the elements.

While the sheath, for example, may be selected from the materials consisting of gallium nitride (GaN), silicon oxide ($SiO_2$), group II–VI materials, group III–V materials, elemental group IV (i.e. Si, Ge), metals, oxides of the above materials, and polymers. It should also be appreciated that the sheath material may be doped as desired (i.e. during formation) to alter the characteristics of the base material.

It will be appreciated, therefore, that the invention generally comprises a method for fabricating a nanotube, comprising (a) forming a nanowire template; (b) depositing a sheath over the nanowire template; and (c) removing the nanowire template. Two embodiments of the method will now be described, one for forming GaN nanotubes over a zinc oxide nanowire template, and one for $SiO_2$ nanotubes over a Si nanowire template. In general, nanotubes according to the present invention may be formed utilizing a casting process, an etching process, or combinations thereof. By way of example, an epitaxial casting process will be described first for producing GaN nanotubes. Then, an oxidation and etching process, such as for producing silicon oxide ($SiO_2$) nanotubes, will be described.

In one embodiment of a nanotube fabrication process according to the present invention, an "epitaxial casting" approach is utilized for the synthesis of single-crystalline nanotubes, such as technologically important gallium (III) nitride (GaN) nanotubes with inner diameters of approximately 30 nm to 200 nm and wall thicknesses of approximately 5 nm to 50 nm. Nanowires, such as within a nanowire array, were used as templates for the epitaxial overgrowth of thin GaN layers in a chemical vapor deposition system. By way of example the nanowire templates can be fabricated from hexagonal zinc (II) oxide (ZnO) material over which the GaN nanotube is grown. The template material is subsequently removed, preferably by a simple thermal reduction and evaporation step, resulting in ordered arrays of GaN nanotubes on the substrates. Arrays of the ZnO nanowires were grown on substrates, such as sapphire wafers, using a vapor deposition process. The same approach to synthesizing nanotubes detailed herein may operate for the majority of group III nitrides.

In another embodiment, nanotubes are formed of silicon oxide ($SiO_2$) in an oxidation process and the nanowire cores removed in an etching process. The nanotube cores (templates) are created from silicon (Si) nanowires, with a cap (i.e. Au), such as fabricated using thermal oxidation and etching. The process comprises thermal oxidation of the Si nanowire arrays which results in arrays of thin Si nanowires sheathed by a thick layer of silicon oxide ($SiO_2$). This oxidized nanowire array is then selectively etched, such as with xenon fluorine ($XeF_2$) to remove the silicon nanowire cores, leaving an array of ordered silicon dioxide nanotubes with controllable inner diameters. The inner diameters are controlled by the initial diameters of the silicon nanowires and the thermal oxidation process. The inner tube diameter of the nanotubes may be controlled in the range of from approximately 10 nm to 200 nm. It is contemplated that, with further refinements of the oxidation and etching process, nanotubes having an inside diameter of less than 5 nm can be produced in this manner.

A number of aspects of the invention are addressed herein, including but not limited to the following.

An aspect of the invention is the formation of nanotube structures.

An aspect of the invention is the formation of single-crystalline nanotube structures.

Another aspect of the invention is forming nanotubes of gallium nitride (GaN).

Another aspect of the invention is forming silica nanotubes ($SiO_2$).

Another aspect of the invention is forming a nanowire to utilize as a template for forming the nanotube.

Another aspect of the invention is utilizing a zinc oxide (ZnO) nanowire as a template for forming the nanotube.

Another aspect of the invention is utilizing a silicon (Si) nanowire as a template for forming the nanotube.

Another aspect of the invention is utilizing an epitaxial casting process to form a sheath of over the nanowire, such as GaN over a ZnO nanowire.

Another aspect of the invention is utilizing an oxidation and etching process to form a sheath of material over the nanowire, such as $SiO_2$ over a Si nanowire.

Another aspect of the invention is the formation of multiple sheath layers over a sacrificial template (core).

Another aspect of the invention is the formation of multiple sheath layers over a sacrificial core.

Another aspect of the invention is the formation of sheath layers in longitudinal segments along the length of a sacrificial core.

A still further aspect of the invention are methods for forming single-crystalline nanotubes which may be utilized in electronic devices, nanofluidic devices, or combinations thereof.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIGS. 1A–1C are cross section views of the epitaxial casting process for fabricating nanotubes according to an embodiment of the present invention, showing GaN nanotubes formed over ZnO nanowires.

FIG. 6 is an image of nanotubes formed according to an embodiment of the present invention and shown end-on.

FIGS. 14A–14G are steps in forming $SiO_2$ nanotubes according to an embodiment of the present invention, shown with parylene deposition stages during etching.

DETAILED DESCRIPTION OF THE INVENTION

Figure 2A:
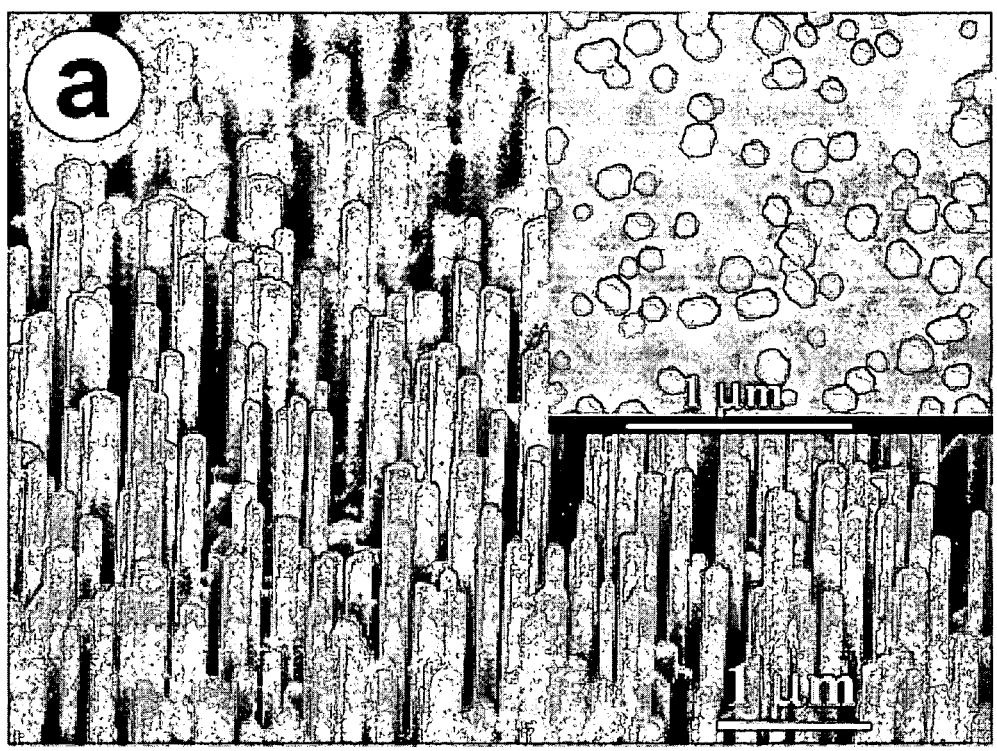
FIG. 2A is an image of a nanowire template array according to an aspect of the present invention fabricated from ZnO, showing in an inset the cross-sections of the nanowire array.

In accordance with the present invention, a nanotube is formed by creating at least one sheath layer around a nanowire template. The nanowire template functions as a sacrificial core which is later removed to establish the central opening through the nanotube. Once the sacrificial core is removed, the nanotube can be used in any conventional manner.

By way of example, and not of limitation, two embodiments of a method of fabricating nanotubes using a sacrificial core in accordance with the present invention will be described. It will be appreciated, however, that the invention contemplates any method in which a sacrificial core is used as a template for nanotube fabrication. In a first embodiment, a layer of material such as gallium nitride (GaN) is epitaxially grown on the exterior of a nanowire core, such as zinc oxide (ZnO), followed by removal of the nanowire core. In a second embodiment, a nanowire core such as silicon (Si) is oxidized to form an $SiO_2$ sheath layer, and then the nanowire core is removed to leave the oxide sheath.

Epitaxial Casting Method

FIG. 1A through FIG. 1C illustrate the general steps in what we refer to as an "epitaxial casting" approach. FIG. 1A depicts a substrate 10 upon which a nanowire 12 is being formed, preferably a single-crystalline nanowire. FIG. 1B depicts depositing a preferably single-crystalline sheath 14 over nanowire 12. FIG. 1C depicts removing the nanowire template (core) 12 thereby forming a nanotube 14'.

In one embodiment, the nanowires 12, such as prefabricated hexagonal-shaped single-crystalline nanowires (preferably ZnO) are employed as templates for tubular deposition of a material, such as GaN. Since ZnO and GaN both have wurtzite crystal structures and have similar lattice constants (ZnO: a=3.249 Å, c=5.207 Å; GaN: a=3.189 Å, c=5.185 Å), GaN can grow epitaxially on the side {110} planes of these ZnO nanocylinders and form a thin GaN layer that is single-crystalline in nature. It will be appreciated that many combinations of materials have sufficiently similar crystalline structures and lattice constants to allow epitaxial growth of the sheath material on the nanowire material.

Once the ZnO nanocylinders are coated with a thin GaN sheath 14 (FIG. 1B), the template 12 (FIG. 1A) is subsequently removed, such as by thermal processes, leaving a GaN nanotube 14'. By way of example and not of limitation, two possible mechanisms for the removal of ZnO templates can be employed.

In one approach, ZnO is chemically etched by ammonia ($NH_3$) at high temperature (see Hamdani F. et al., Effect of buffer layer and substrate surface polarity on the growth by molecular beam epitaxy of GaN on ZnO, *Appl. Phys. Lett.* 71, 3111–13 (1997), incorporated herein by reference).

Prolonged heating of samples after GaN coating in ammonia (NH$_3$) readily yields pure GaN nanotubes (FIG. 1C).

Another approach is to utilize a thermal reduction process at high temperatures (e.g. 600° C. in hydrogen gas, H$_2$). The single-crystalline wurtzite GaN nanotubes here differ fundamentally from theoretically simulated GaN nanotubes, where a metastable graphitic GaN structure was proposed (see Lee S. M., Stability and electronic structure of GaN nanotubes from density-functional calculations, et al. Phys. Rev. B, 60, 7788–7791 (1999), incorporated herein by reference).

EXAMPLE 1

The nanowire cores employed in the present invention can be formed in any conventional manner. For example, arrays of zinc oxide (ZnO) nanowires were grown on a substrate material, such as (110) sapphire wafers, preferably using a vapor deposition process (see Huang M. et al., Room-temperature ultraviolet nanowire nanolasers, *Science*, 292, 1897–99 (2001), incorporated herein by reference). These ZnO nanowire arrays were placed inside a reaction tube (i.e. MOCVD reaction tube) for GaN chemical vapor deposition. Trimethylgallium and ammonia were used as precursors and fed into the system with argon or nitrogen carrier gas. The deposition temperature was set at 600° C. to 700° C.

After the GaN deposition, the samples were treated in a hydrogen atmosphere at elevated temperature, such as 600° C. with 10% H$_2$ in argon, for removing the ZnO nanowire templates. It should be appreciated that other methods and materials may be utilized (although in some instances less preferably) for forming the nanowires, covering the nanowires with the nanotube material, and for sacrificially removing the nanowire material (in select applications only a portion of the nanowire material need be removed according to the present invention).

FIG. 2A shows a scanning electron microscopy (SEM) image of the starting ZnO nanowire array templates, which were found to have uniform lengths, such as in the range of from 2–5 μm, and each having a uniform diameter with diameters within the array of nanowires ranging from 30–200 nm. The nanowires are well-facetted as seen in the inset of FIG. 2A with hexagonal cross-sections, exhibiting {110} planes on the sides. After the GaN deposition and template removal to form the nanotubes, the color of the sample had shifted from white to yellowish or darker.

Figure 2B:
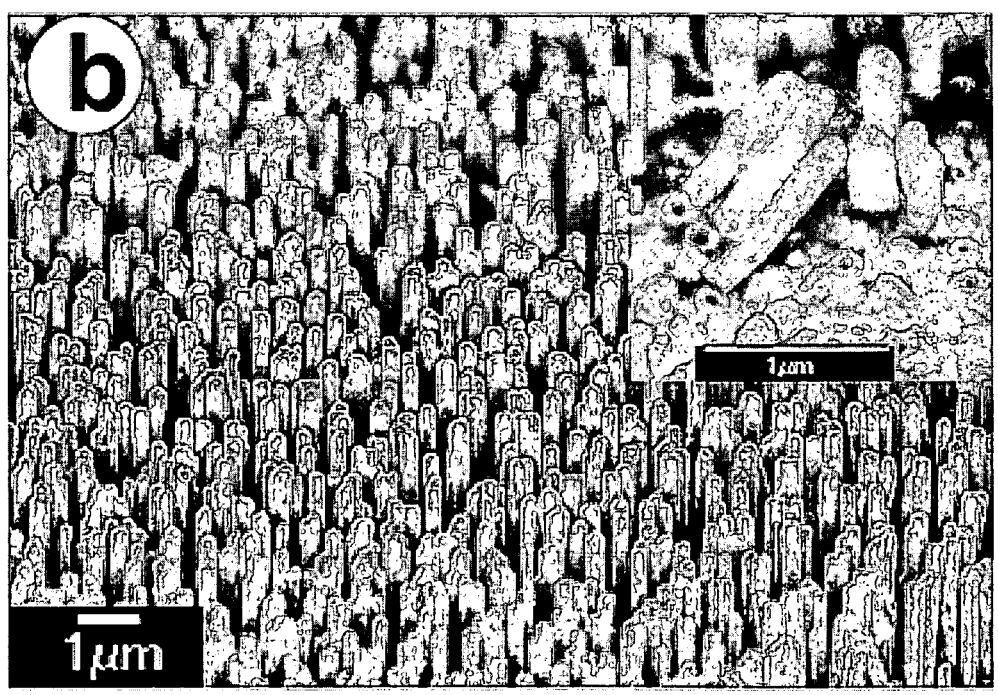
FIG. 2B is an image of a nanotube array formed over the sacrificial nanowire array of FIG. 2A according to an aspect of the present invention fabricated from GaN, shown in an inset is the fractured interface between the GaN nanotubes and the substrates.

FIG. 2B is an example image illustrating that the morphology of the initial nanowire arrays was maintained in the nanotubes, except for the increase in the diameters of the resulting nanostructures. The nanostructures appear less facetted compared with the original ZnO nanowire templates. Compositional analysis on the final product shows only a relatively minor Zn signal.

Figure 3:
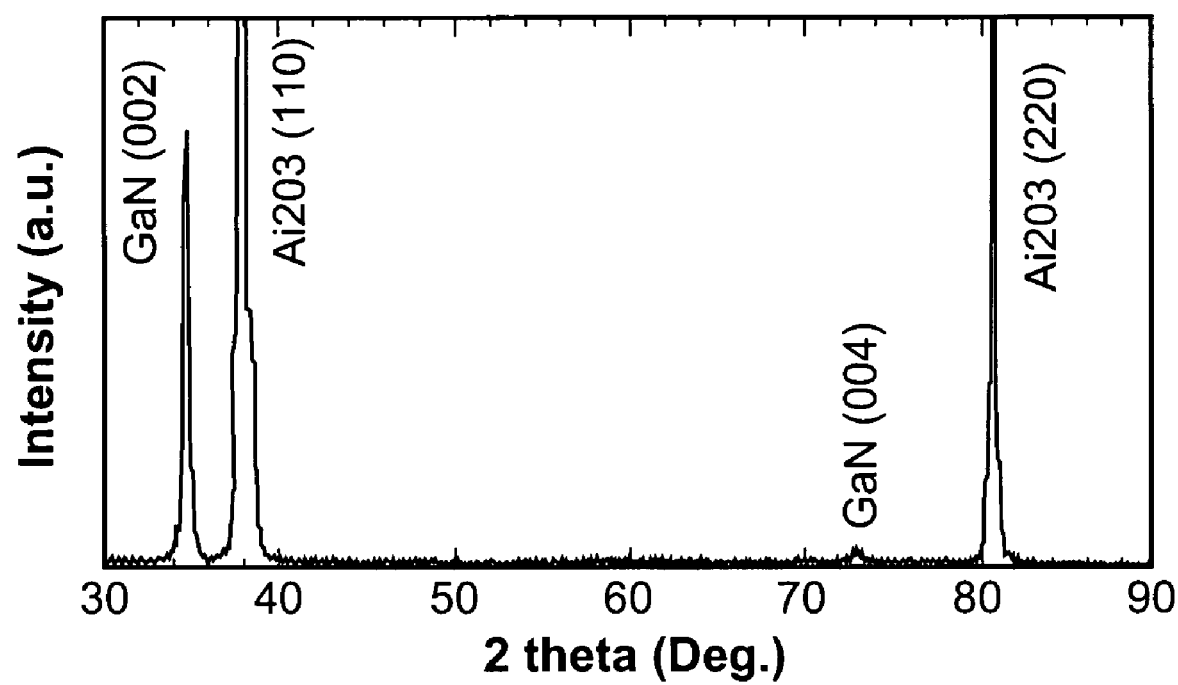
FIG. 3 is a plot of diffraction of the GaN nanotube array of FIG. 2B according to an aspect of the present invention, showing nanotube composition.

FIG. 3 illustrates the result of X-ray diffraction (XRD) on the sample which shows only (001) diffraction peaks of the wurtzite GaN structure indicative of excellent epitaxy/texturing for the GaN coating.

Figure 4A:
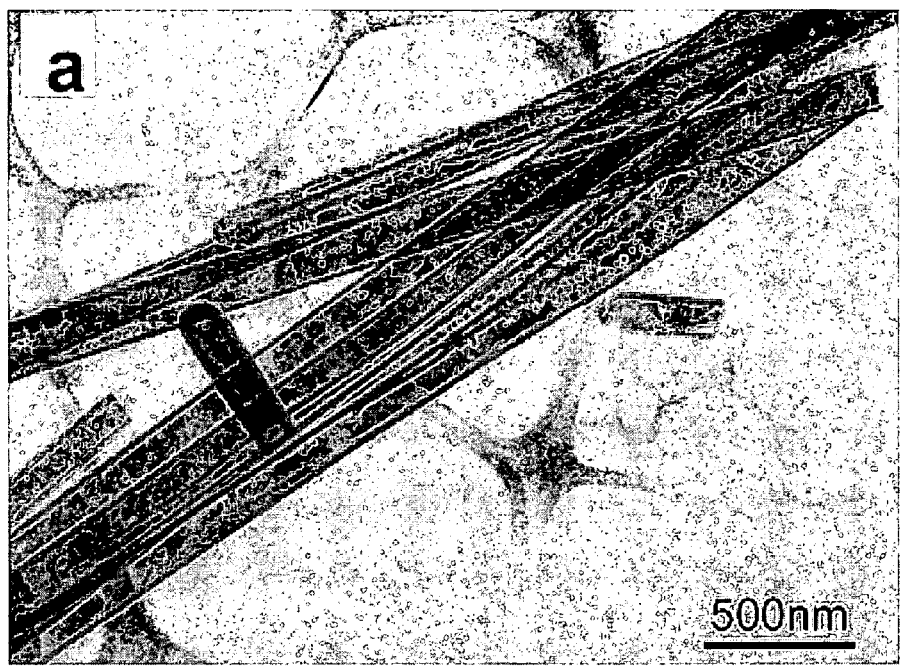
FIGS. 4A–4C are images of the nanotubes of FIG. 2B according to an aspect of the present invention, showing the relative uniformity in diameter and wall thickness.
Figure 4B:
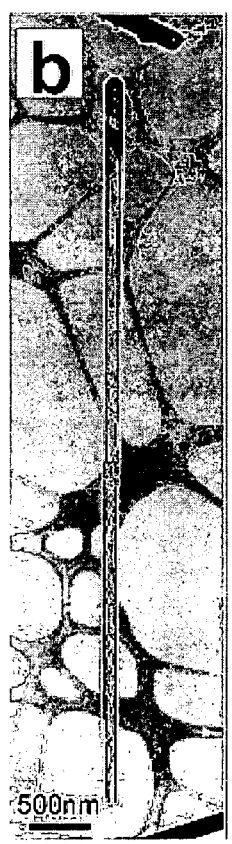
Figure 4C:

FIG. 4A through FIG. 4C depict images of dispersing the GaN nanotubes sample in FIG. 2B onto a transmission electron microscopy (TEM) grid for further structural analysis. It was found that the majority of the nanostructures exhibit tubular structures with uniform wall thicknesses, which can be generally seen from FIG. 4A. These nanotubes were found to have inner diameters ranging from 30 nm to 200 nm, similar to the ZnO nanowire arrays, and wall thicknesses between 5 nm to 50 nm.

It was found that the majority of the nanotubes have only one end open, however, tubes with both ends open were also observed. These observations are consistent with the SEM studies, where round-shaped and less-facetted ends are observed after the GaN coating, as depicted in FIG. 2B. It was concluded that the open nanotube ends are originally located at the GaN and substrate interface, which were fractured open during TEM sample preparation. Indeed we have frequently observed these open ends on the substrate surface together with the corresponding nanotubes, an example of which is shown in the inset of FIG. 2B. TEM studies also indicate that the inner cross-section of the nanotubes remains pseudo-hexagonal after template removal.

Figure 4D:
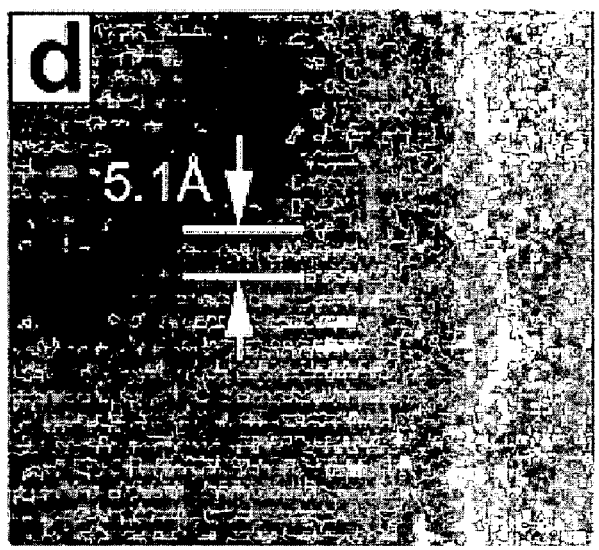
FIG. 4D is a high resolution image of the exterior wall structure in a GaN nanotube of FIG. 2B according to an aspect of the present invention.
Figure 4E:
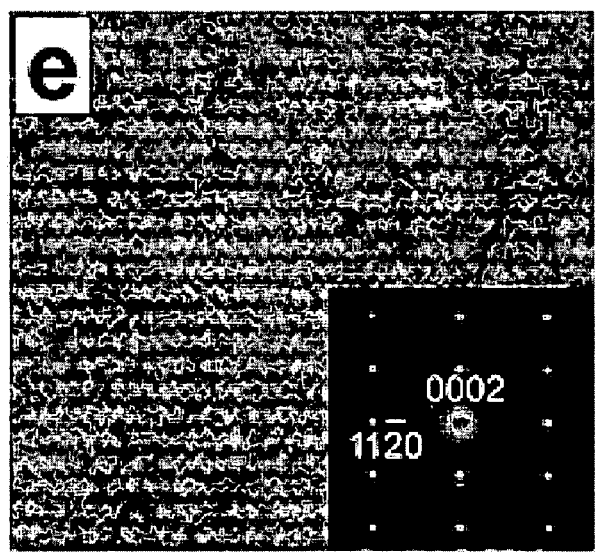
FIG. 4E is a high resolution image of the interior wall structure in a GaN nanotube of FIG. 2B according to an aspect of the present invention, shown with inset of electron diffraction pattern taken on the nanotube along the [110] zone axis.

Significantly, electron diffraction (ED) taken on these GaN nanotubes indicates that these tubes are single-crystalline. Returning to FIG. 4E, the inset shows one ED pattern taken along the [110] zone axis. It can be readily seen, that the nanotube is oriented along the c-axis of the wurtzite GaN structure. This is consistent with the XRD data where only (001) peaks were observed. Along the tube axis, a lattice spacing of 0.51 nm for (001) planes of the wurtzite structure can be readily resolved on high resolution TEM images of both the tube surface FIG. 4D and the inside of the tubes FIG. 4E.

Figure 5:
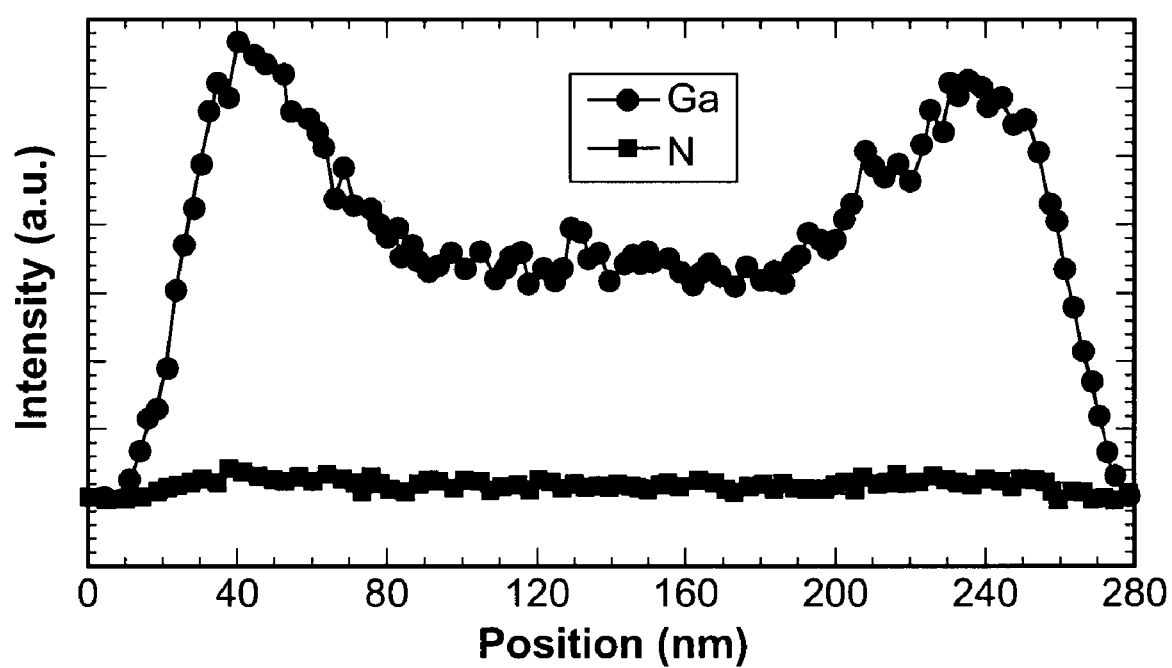
FIG. 5 is a plot of nanotube composition across the nanotube profile according to an aspect of the present invention, as probed by energy dispersive X-ray spectroscopy.
Figure 8:
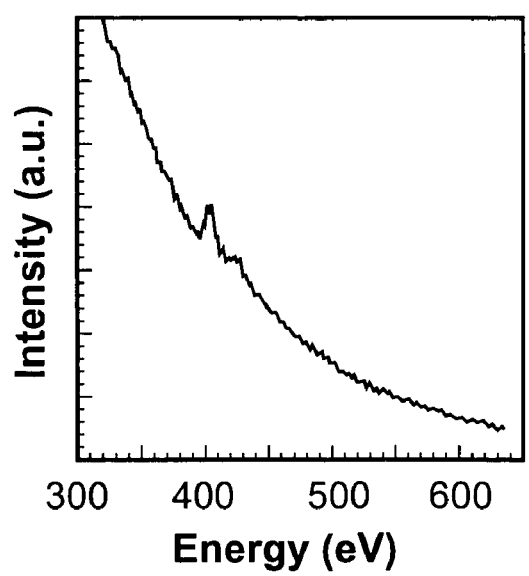
FIG. 8 is a plot of the electron energy loss spectrum collected on the GaN nanotube of FIG. 7.

FIG. 5 illustrates compositional line profile probed by energy dispersive X-ray spectroscopy (EDX) showing well-correlated gallium and nitrogen signals across the tube walls which are indicators of stoichiometric GaN formation during the deposition. This is also clearly reflected in the electron energy loss spectra (EELS) recorded on these nanotubes, as shown in FIG. 8, where strong nitrogen signals were observed. It should be noted that the interfacial diffusion between the GaN layer and the ZnO nanowire templates result in a small amount of Zn or O incorporation within the GaN tube wall.

Figure 6:

FIG. 6 is a transmission electron microscopy image of an end-on view of several GaN nanotubes. At least two important features can be seen in the image: (1) the inner cross-section of the tubes is pseudo-hexagonal, (2) nanotubes are connected at their base with a porous GaN layer, which is believed to be the primary pathway for the escape of zinc and oxygen species during thermal/chemical etching.

Figure 7:
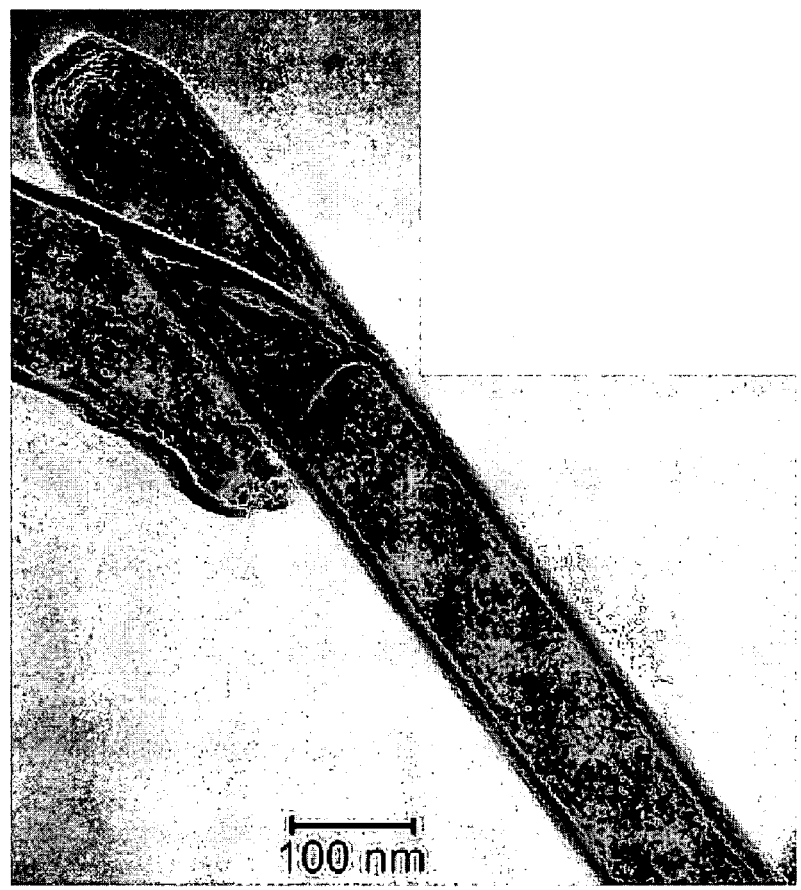
FIG. 7 is an image of a single-crystalline GaN nanotube fabricated according to an embodiment of the present invention and showing its smooth features.

FIG. 7 is a transmission electron microscopy image of a single-crystalline GaN nanotube showing its very smooth internal and external surface.

FIG. 8 is a plot of nitrogen K-edge electron energy loss spectrum collected on the GaN nanotube of FIG. 7.

Taken together, it will be appreciated that high-density arrays of single-crystalline nanotubes can be successfully prepared, such as described for GaN nanotubes fabricated on sapphire substrates. It is important to point out that the GaN nanotube formation process described herein is a marked departure from previous work on inorganic nanotubes (see Iijima, S., Helical microtubules of graphitic carbon, *Nature*, 354, 56 (1991); Tenne, R. & Zettl, A. K., Nanotubes from inorganic materials, *Top. Appl. Phys.* 80, 81–112 (2001); Tenne, R., Inorganic nanoclusters with fluorine-like structure and nanotubes, *Prig. Inure. Chem.* 50, 269–315 (2001); Partake, G. R., Cromlech, F. & Nester, R., Oxidic nanotubes and nanorods—Anisotropic modules for a future nanotechnology, *Angew. Chem. Int. Ed.* 41, 2446–2461 (2002); Martin, C. R., Nanomaterials—a membrane-based synthetic approach, *Science*, 266, 1961–65 (1994); Ajayan, P. M. et al., Carbon nanotubes as removable templates for metal-oxide nanocomposites and nanostructures, *Nature*, 375, 564–566 (1996), these being incorporated herein by reference).

Previous studies on inorganic nanotubes have been directed toward materials with layered structures (e.g. $VO_x$, $MOS_2$, $NiCl_2$, BN). For those studies on materials that do not have structural anisotropy, (in porous alumina) templating approaches (see Caruso, R. A & Antonietti, M. Sol-Gel nanocoating: an approach to the preparation of structured materials, *Chem. Mater.* 13, 3272–3282 (2001), incorporated herein by reference) are generally used, which result in predominantly amorphous or polycrystalline tubes. The distinction between amorphous or polycrystalline tubes and the beneficial single crystal tubes shown as being preferably fabricated according to the present invention will be readily recognized by one of ordinary skill in the art.

Figure 9A:
FIG. 9A is an image of an array of nanotubes fabricated according to an embodiment of the present invention, and shown with the nanowire template partially removed.

FIGS. 9A, 9B and FIG. 10, FIG. 11 illustrate details of removing the nanowire template within the single-crystalline nanotube. The "epitaxial casting" mechanism described by the invention has been confirmed with TEM studies. In FIG. 9A arrays of GaN nanotubes are shown with their ZnO nanowire templates partially removed. It should be noted that at the bottom of these nanotubes a thin layer of porous GaN film exists. In addition, residues of ZnO nanowire templates remain in the upper portion of the sealed GaN nanotubes. These two observations suggest that the zinc and oxygen species (generated during the thermal chemical etching process) escape from the GaN nanotubes primarily through the underneath porous GaN layer (as shown in FIG. 6).

Figure 9B:
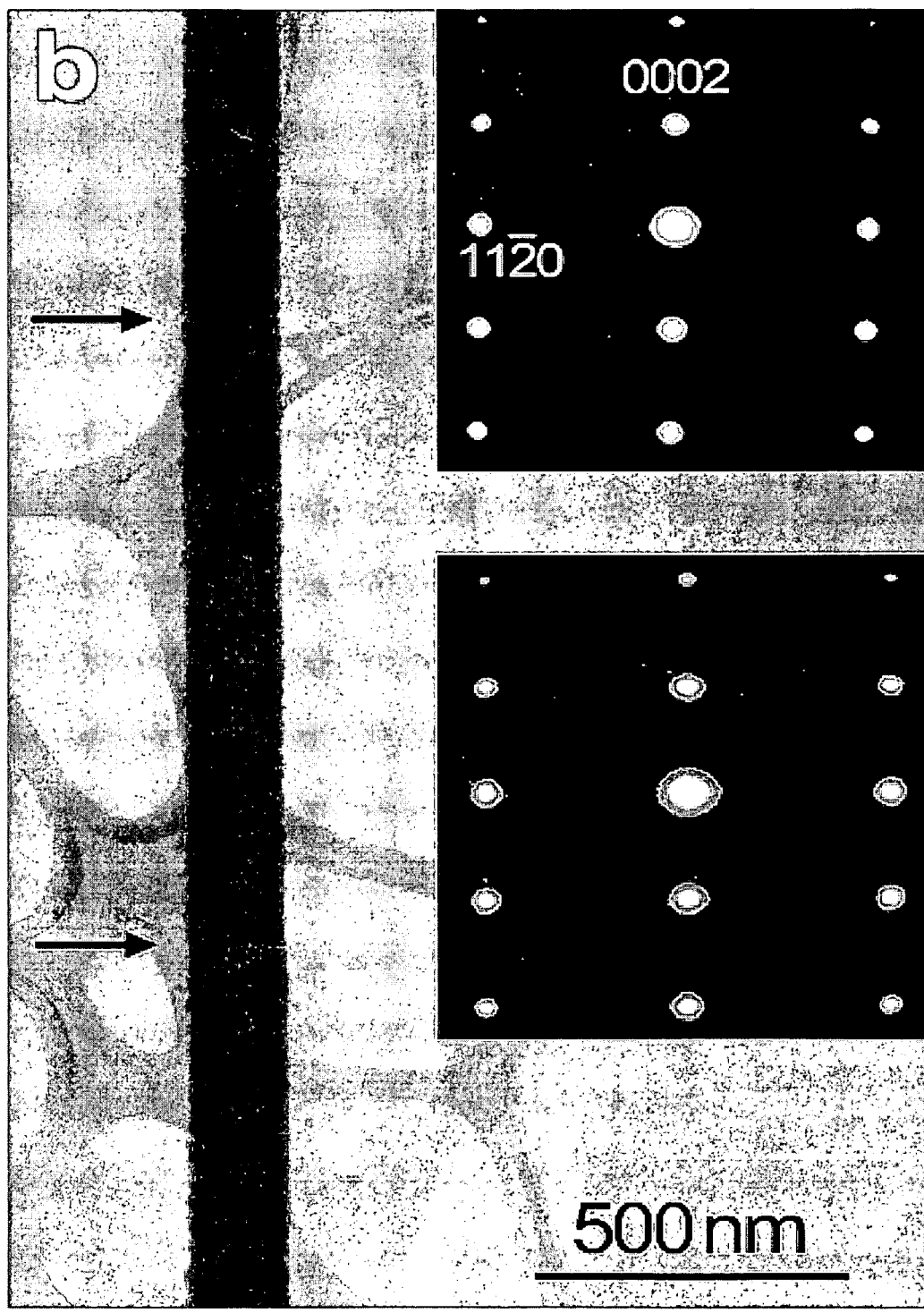
FIG. 9B is an image of a nanotube fabricated according to an embodiment of the present invention with nanowire template partially removed, showing insets of electron diffraction patterns recorded on the core-sheath and the pure tube region along the [110] zone axis.
Figure 10:
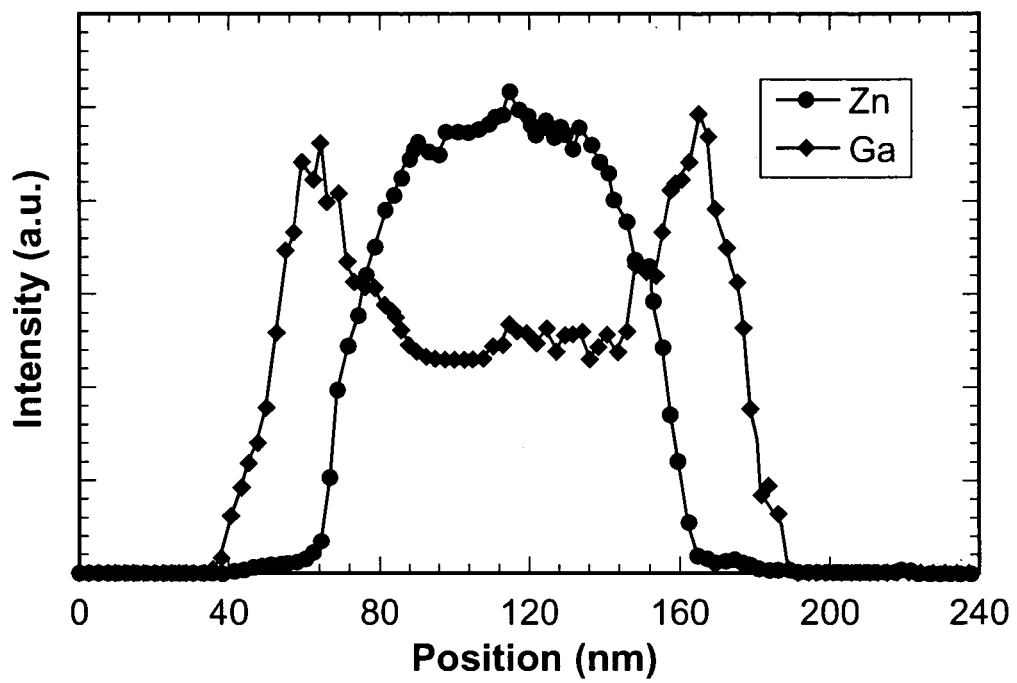
FIG. 10 is a plot of line profiles for the core-sheath of a nanotube at the upper arrow position in FIG. 9B, and showing Ga and Zn signals.
Figure 11:
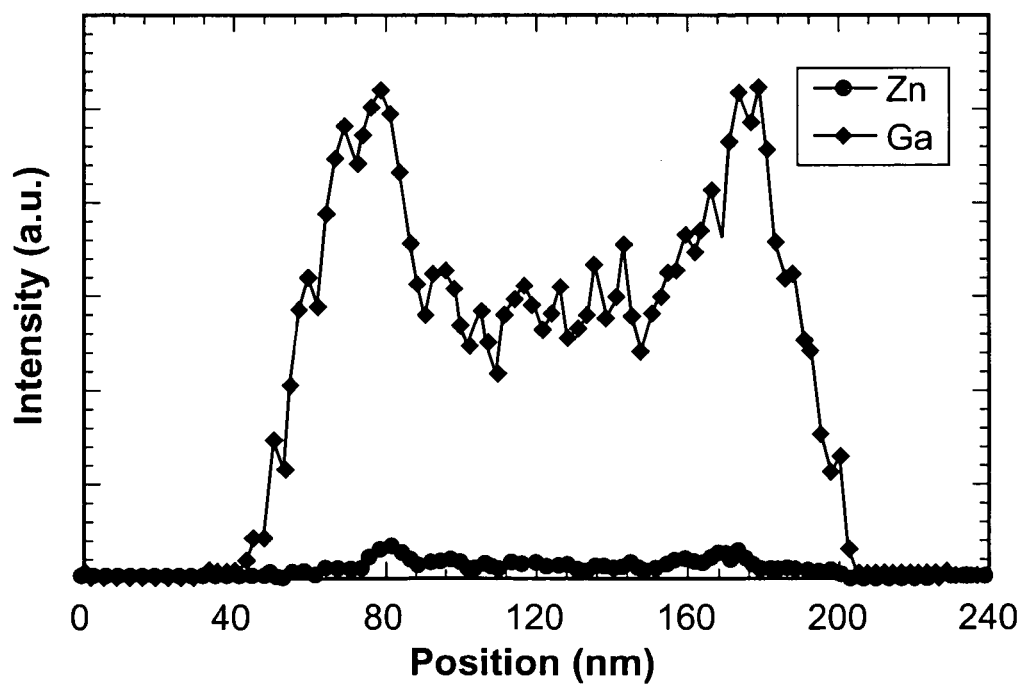
FIG. 11 is a plot of line profiles for the core-sheath of a nanotube at the lower arrow position in FIG. 9B, and showing Ga and Zn signals.

In FIG. 9B a detailed view of a nanotube with a partially removed template is shown at the boundary between the filled (upper arrow) and empty portions (lower arrow) of the nanotube. Electron diffraction shown on the insets of FIG. 9B for the filled and unfilled portions of the nanotube depict an identical set of diffraction patterns for both the tube and the core-sheath region, indicating the wurtzite GaN growth is epitaxial.

The core-sheath nanostructure can be considered as a seamless single domain of a wurtzite GaN/ZnO structure type. Furthermore, comparison of EDX line profiles across the GaN nanotube (aligned at lower arrow) shown in FIG. 11 and the ZnO—GaN core-sheath structure, aligned at the upper arrow, and shown in FIG. 10 unambiguously support the growth mechanism of GaN nanotubes on the ZnO nanowire templates. Once the ZnO nanocylinder is removed, single-crystalline tubes of GaN result. The formation of these single-crystalline GaN nanotubes as taught herein accords a number of benefits over the use of polycrystalline nanotubes (see Li, J. Y. et al. Synthesis of GaN nanotubes, *J. Mater. Sci. Lett.* 20, 1987–1988 (2001), incorporated herein by reference), in particular in view of the fact that these polycrystalline nanotubes are generally subject to having an irregular shape. It is also interesting to note that microscale tubes of ZnO have been prepared in solution through a preferential chemical dissolution process (see Vayssieres, L., Keis, K., Hagfeldt, A. & Lindquist, S. Three-dimensional array of highly oriented crystalline ZnO microtubes, *Chem. Mater.* 13, 4395–4398 (2001), incorporated herein by reference).

Importantly, the electrical and optical characteristics of these single-crystalline GaN nanotubes are comparable to those of high-quality GaN epilayers grown on ZnO substrates (see Hamdani F. et al., Microstructure and optical properties of epitaxial GaN on ZnO (0001) grown by reactive molecular beam epitaxy, *J. Appl. Phys.* 83, 983–990 (1998), incorporated herein by reference) as well as those of GaN nanowires (see Huang, Y., Duan, X., Cui, Y. & Lieber, C. M. Gallium nitride nanowire nanodevices, *Nano. Lett.* 2, 101–104 (2002); Kim, J. et al. Electrical transport properties of individual gallium nitride nanowires synthesized by chemical vapor deposition, *Appl. Phys. Lett.* 80, 3548–3550 (2002), incorporated herein by reference).

Figure 12:
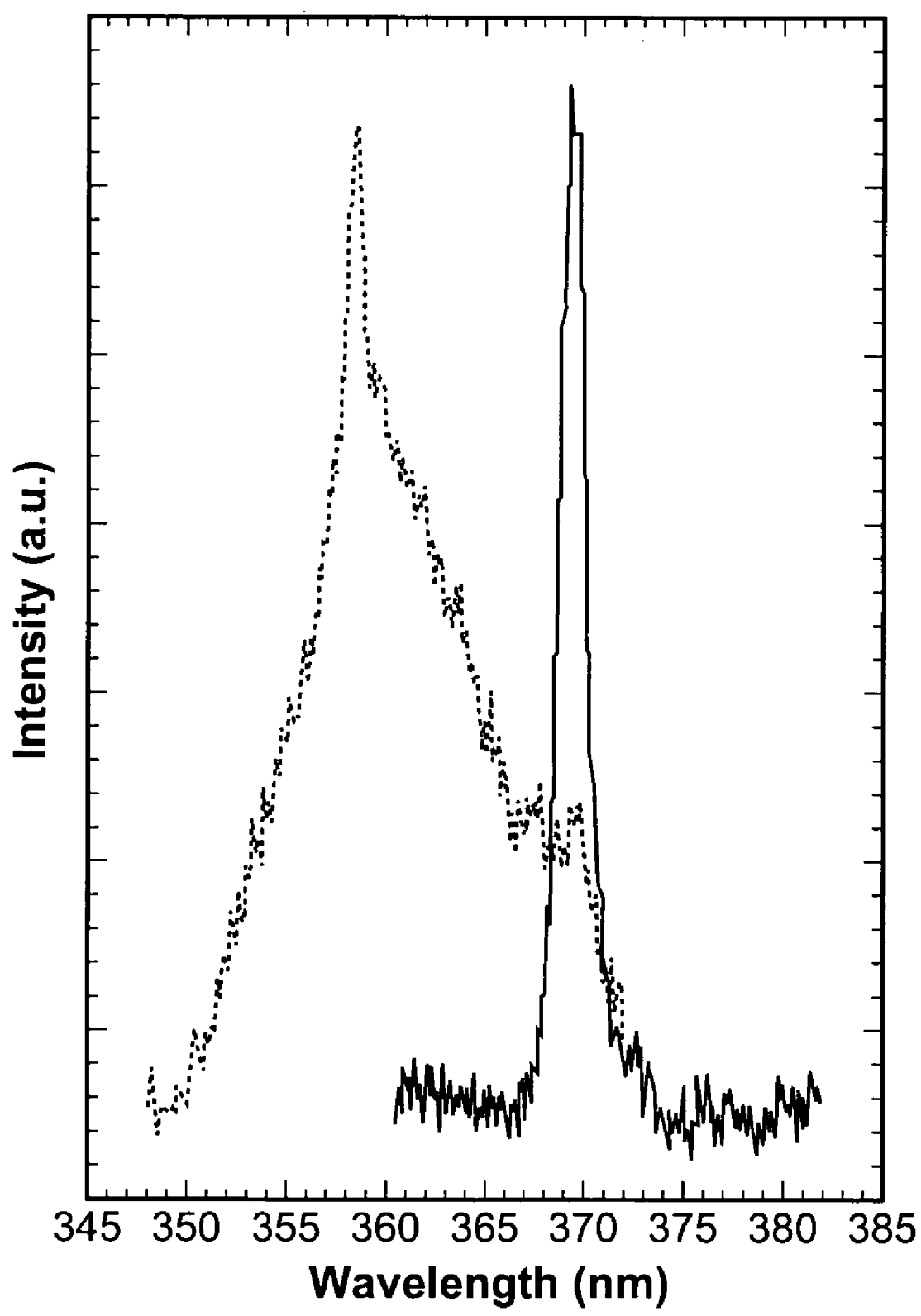
FIG. 12 is a plot of photoluminescence spectra collected on a GaN nanotube according to an aspect of the present invention, showing spectra from both a thin-walled and thick-walled nanotube.

FIG. 12 depicts a low temperature photoluminescence (PL) spectra plot of the as produced nanotubes measured using fourth harmonic output of a YAG laser (266 nm) as an excitation source. It should be noted that no midgap yellow emission was observed. The band edge emission was observed in these nanotube samples between 375 nm and 360 nm, with the thinner tubes emitting at shorter wavelengths. This slight blue shift of the emission (see Hamdani F. et al., Microstructure and optical properties of epitaxial GaN on ZnO (0001) grown by reactive molecular beam epitaxy, *J. Appl. Phys.* 83, 983–990 (1998), incorporated herein by reference) could be attributed to the quantum confinement effect since some of the nanotubes have walls as thin as 5 nm, which is smaller than the exciton Bohr radius of GaN.

Referring to the figure, photoluminescence spectra was collected on the GaN nanotubes at 10 K. The samples were excited by 266 nm line of a pulsed Nd:YAG laser (i.e. Spectra Physics™). The photoluminescence signal was transmitted to a 0.3 meter imaging monochromator by an optical fiber, detected by an intensified CCD working under gate mode. Only band edge emission was observed, with the spectra depicted on the left corresponding to the spectra collected on thin-walled (<10 nm) GaN nanotubes, while the spectra depicted on the right corresponds to the spectra collected from thick-walled ($\geqq 10$ nm) GaN nanotubes, respectively. It should be appreciated that the emission spectra for the thin tubes is relatively broad due to the broad distribution of tube wall thicknesses for the tested sample.

Figure 13:
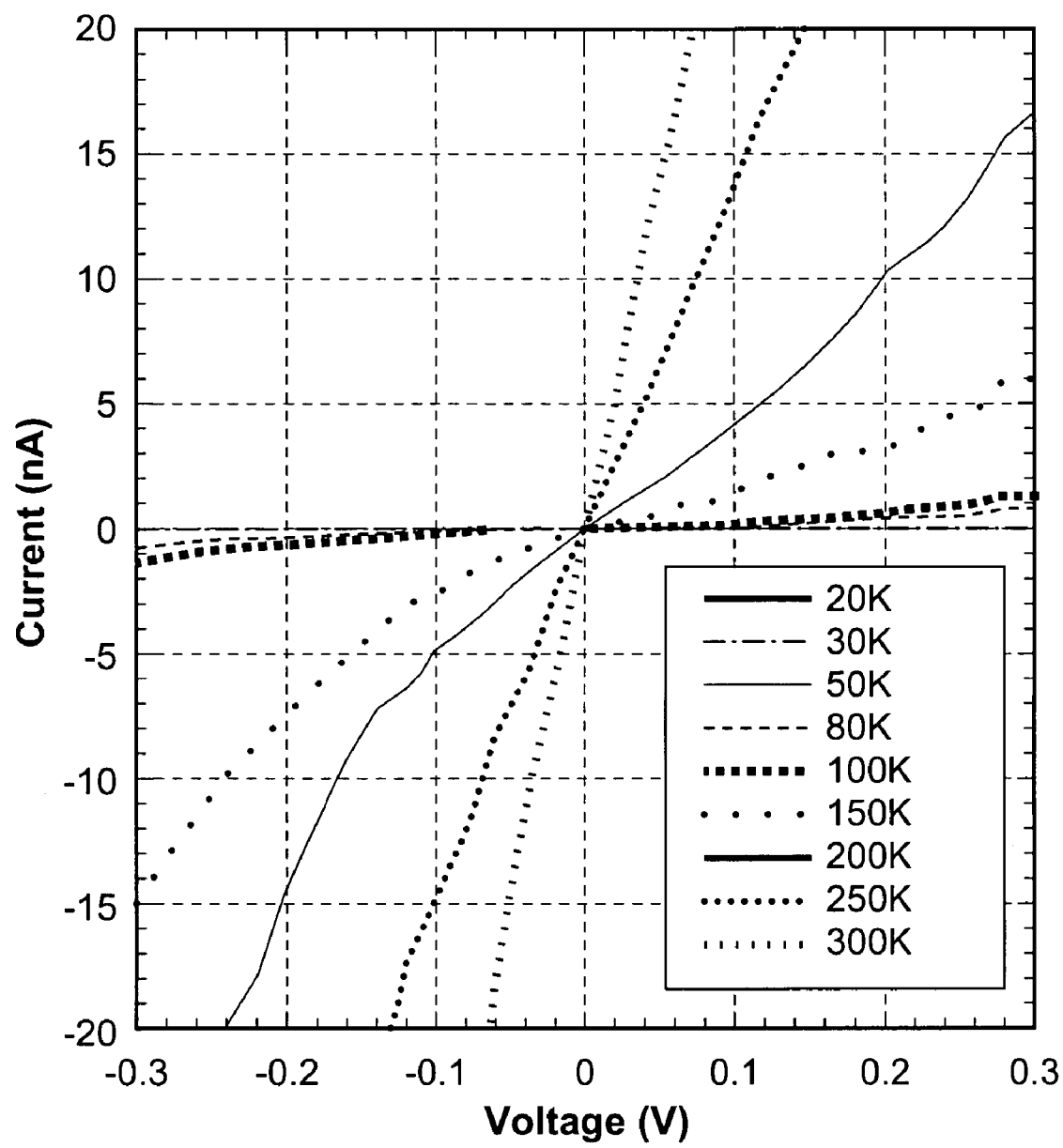
FIG. 13 is a plot of temperature dependence curves of a single GaN nanotube according to an aspect of the present invention.

FIG. 13 depicts an example of electron transport measurements which indicate the resistances of these nanotubes are on the order of 10 MΩ at room temperature and increases with decreasing temperature, similar to those of high quality GaN nanowires. Referring to the figure, temperature dependence I–V curves of a single GaN nanotube are shown. The electrodes (20 nm titanium, Ti and 80 nm gold, Au) for the electrical measurements were fabricated using e-beam lithography and thermal evaporation, although other techniques may be utilized. To form a stable contact, a rapid thermal annealing step was performed at 450° C. for about thirty seconds, although any convenient means of contact formation may be utilized.

The successful preparation of single-crystalline GaN nanocapillaries utilizing the present epitaxial casting process is indicative of the ability to prepare nanotubes/nanocapillaries, in particular single-crystalline nanotubes/nanocapillaries, of inorganic solids having non-layered crystal structures. It is anticipated that this new class of semiconductor nanotubes/nanocapillaries can be utilized in a number of beneficial technical applications in the fields of nanoscale electronics, optoelectronics, and chemistry in addition to use with fluidic systems. The present invention provides robust semiconductor nanotubes, having uniform inner diameter, and inner walls that can be readily functionalized, while both ends of the nanotubes can be made accessible for fluid flow applications.

Oxidation and Etching Method

Referring now to FIG. 14A through FIG. 14G, a second method of fabricating nanotubes using a sacrificial template according to the present invention is illustrated. We refer to this method as "oxidation and etching" since this method forms robust nanotube arrays by translating vertical nanowire arrays into oxide nanotube arrays. In one embodiment, nanotube cores (templates) are formed from silicon (Si) nanowires, with a metal cap (i.e. Au), such as commonly fabricated using thermal oxidation and etching. Next, the Si nanowire arrays are thermally oxidized which results in arrays of thin Si nanowires sheathed by a thick layer of silicon oxide ($SiO_2$). This oxidized nanowire array is then selectively etched, such as with xenon fluorine ($XeF_2$) to remove the silicon nanowire cores, leaving an array of ordered silicon dioxide nanotubes with controllable inner diameters. The inner diameters are controlled by the initial diameters of the silicon nanowires and the thermal oxidation process. The inner tube diameter of the nanotubes may be in the range of from approximately 10 nm to 200 nm.

It should be appreciated that single nanotubes or random samples can be formed as an alternative to forming the nanotubes in an array. Other nanotube compositions can also be fabricated in this manner as well, including, but not limited to, GaO, InO and other oxides and insulating materials. The following describes implementation details of an embodiment of the present fabrication process.

EXAMPLE 2

FIG. 14A illustrates silicon nanowire arrays which were prepared using chemical vapor deposition (CVD) epitaxial growth employing silicon tetrachloride ($SiCl_4$, Aldrich, 99.99%) as the silicon source. Hydrogen (10% balanced by argon) was used to reduce $SiCl_4$ at high temperature (900–950° C.). Gold (Au) thin film was coated on Si (111) substrates 30 to initiate the growth of silicon nanowires 32 via the vapor-liquid-solid growth mechanism. The gold remains as caps 34 on the Si nanowires. This approach to growing Si nanowires was developed and is utilized in our lab for the synthesis of vertical Si/SiGe superlattice nanowire arrays (see Wu, Y.; Fan, R.; Yang, P. D. Nano Lett. 2002, 2, 83; Wu, Y.; Yan, H.; Huang, M.; Messer, B.; Song, J.; Yang, P. Chem.-Eur. J. 2002, 8, 1260; incorporated herein by reference). The silicon nanowire array samples were heated, such as loaded into a tube furnace and heated at 800–1000° C. for one hour under the continuous flow of pure oxygen ($O_2$).

FIG. 14B depicts the nanowires 32 after being uniformly oxidized to provide $SiO_2$ sheaths 36 with continuous silicon cores inside. During oxidation, the nanowire tips 34 are preferably oxidized to provide an oxide cap 34' on each vertical wire for preventing the selective etching of silicon cores. Therefore, the first step after thermal oxidation is to selectively remove the $SiO_2$ caps 34' from the Si/$SiO_2$ core-sheath nanowires.

FIG. 14C illustrates a preferred mode of removing the $SiO_2$ caps. A polymer 38 is deposited to fill in the space between the nanowires such that the $SiO_2$ sidewall 36 is protected by the matrix polymer as an etch-resistant material. In the present example, parylene dimer (di-para-xylylene, ($—CH2-Ph-CH_2—)_2$) was thermally evaporated at 160° C., dissociated at about 650° C. and deposited onto the Si/$SiO_2$ core-sheath nanowire array sample for approximately five (5) hours to yield a continuous coating of parylene (poly-para-xylylene, ($—CH_2-Ph-CH_2—)_n$) polymer. This parylene deposition is conformal, starting from thin layer coating on the surface of nanowires and then filling all the interval space between nanowires. This process leads to a highly conformal wrapping of the nanowires without pinholes or cracks.

FIG. 14D illustrates the core-sheath array subsequent to oxygen plasma etching of the surface of the polymer fill 38, such as the parylene in order to expose the tips of the Si/$SiO_2$ nanowires.

FIG. 14E depicts the core-sheath array after immersion in a buffered hydrofluoric acid solution for about two (2) minutes to selectively remove the $SiO_2$ caps 34' and expose the silicon cores 32.

FIG. 14F illustrates the sheath array after the silicon nanowire cores 32 were removed by an etchant, such as $XeF_2$ etchant gas. It will be noted that although some material has been removed, a layer of etch-resistant material 38' still protects the bulk of the nanotube walls. Etching is preferably performed by loading the core-sheath array into a $XeF_2$ etching chamber, with a chamber temperature for example being adjusted to 40° C. After purging and flushing with nitrogen, the $XeF_2$ vapor was introduced together with nitrogen gas, $N_2$ ($XeF_2:N_2=4:5$) to conduct etching for thirty (30) seconds at total pressure of about nine Torr. The chamber was then evacuated and flushed with nitrogen and etching carried out for a second cycle. In the present embodiment eight cycles were carried out to achieve complete etching of the silicon cores.

According to the above process silica nanotube arrays were obtained which are embedded in the parylene membrane 38, wherein the continuous pores run through the entire polymer film.

FIG. 14G depicts a resulting nanotube array 36' after the parylene matrix was etched away, such as using high-power oxygen plasma treatment for thirty (30) minutes to yield a vertically oriented, robust silica nanotube matrix attached to substrate 30.

EXAMPLE 3

Figure 15A:
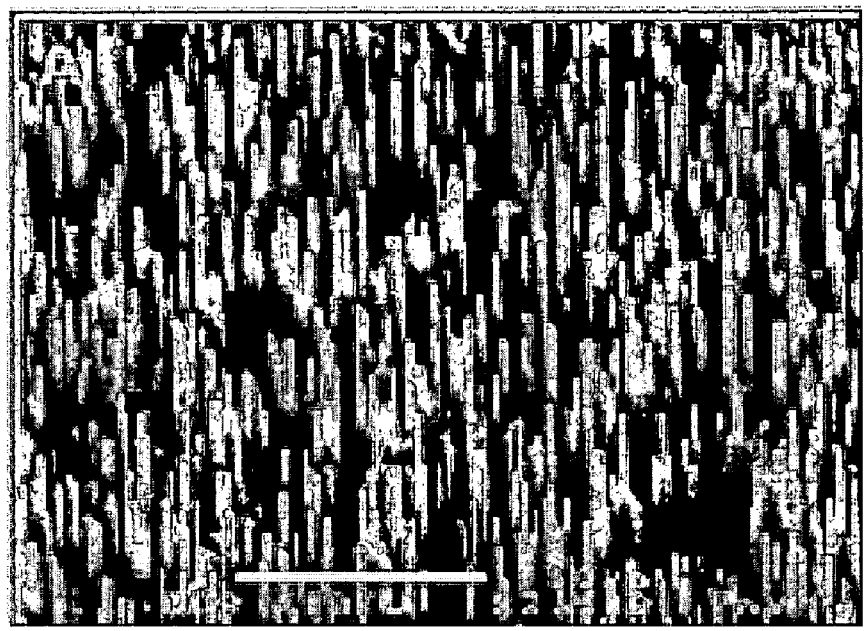
FIGS. 15A–15D are images of silicon nanotube array formation according to aspects of the present invention, shown including detail views on insets of FIGS. 15B–15D.

FIGS. 15A–15D are images of nanotube formation according to the invention, registered as scanning electron micrographs (SEM). A silicon nanowire array is shown in FIG. 15A, with the Si nanowires vertically orientated to form a substantially perfect array. Typical sizes of the silicon nanowires are 50–200 nm, and the length is around 8 μm. On the top of each nanowire can be seen a bright gold tip indicative of the vapor-liquid-solid growth (see Wu, Y.; Yan, H.; Huang, M.; Messer, B.; Song, J.; Yang, P. Chem.-Euro. J. 2002, 8, 1260, incorporated herein by reference).

Figure 15B:
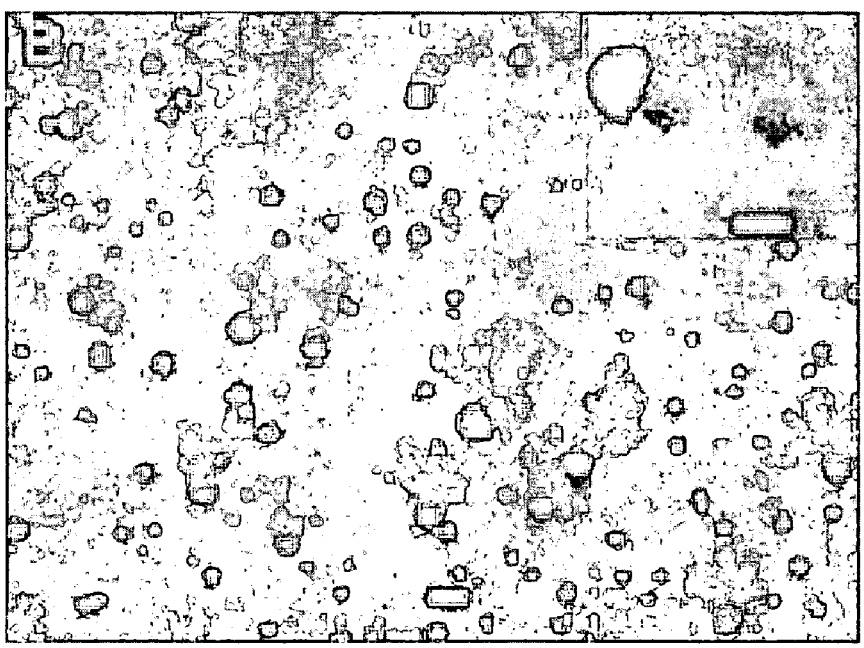

FIG. 15B illustrates the nanotubes after parylene deposition, $SiO_2$ cap removal, and the etching of the silicon cores, wherein a silica nanotube array embedded in parylene membrane is formed. The pores can be readily seen on the polymer surface. The bright spots on the image corresponding to the gold nanoparticle tips, which nearly take the shape of half spheres. The membrane has a relatively flat surface. The inset within FIG. 15B depicts high magnification of two silica nanotubes embedded in the parylene membrane, clearly showing the hollow pores with silica walls.

Figure 15C:
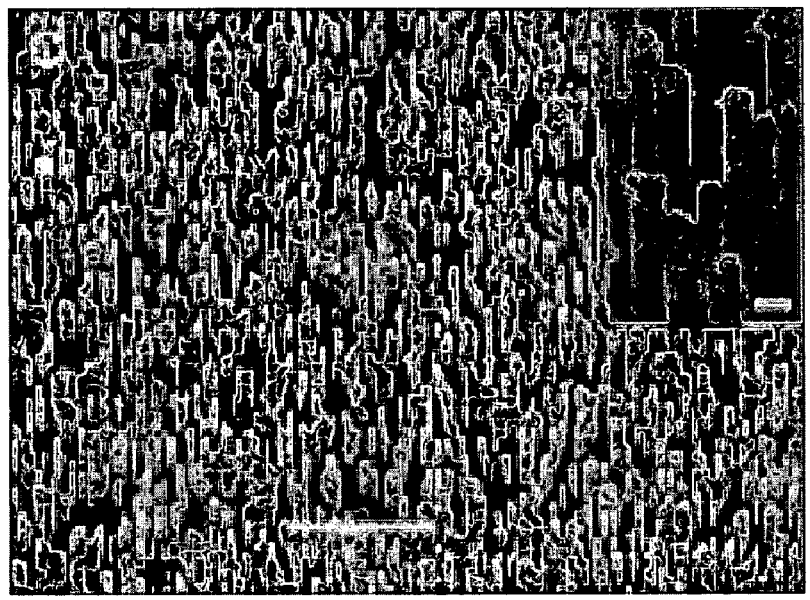
Figure 15D:
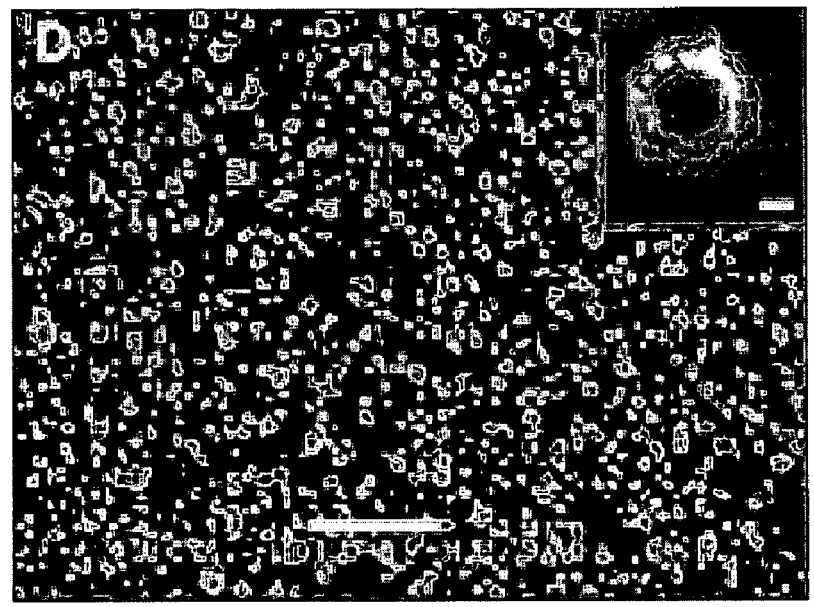

FIG. 15C and FIG. 15D are perspective and top views, respectively, of the nanotube array after oxygen ($O_2$) plasma etching of parylene wherein a free-standing silica nanotube array is obtained. As can be seen, the nanotubes are well aligned and retain the vertical orientation of the starting silicon nanowire templates. The inset of FIG. 15C shows a zoom view of the nanotubes in a high magnification SEM image showing clearly the morphology of the vertical nanotube array. The images reveal that the Si nanowires are vertically oriented in an array, with uniform diameters along their length ranging from approximately 50 nm to 200 nm, with lengths of up to approximately 8 μm, and an average length of about 5 μm. The average diameter of the resulting silica nanotubes exceeds that of the template silicon nanowires, as a result of the structural expansion caused by thermal oxidation. The inset of FIG. 15D is a detailed top view from which the hexagonal shape of the tube is visible. The scale bars on FIGS. 15A, 15B, 15C are 10 μm, 1 μm, and 10 μm respectively. The silica walls of the nanotubes were found to exhibit a well-defined hexagonal shape indicative of the <111> orientation of the original Si nanowires and the anisotropic in-plane etching rates.

Figure 16A:
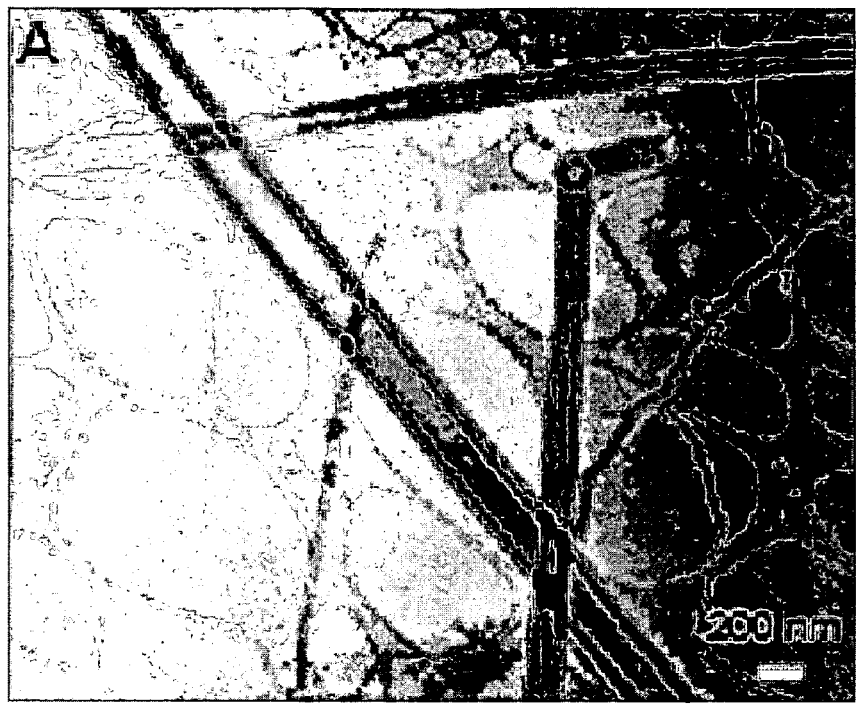
FIGS. 16A–16B are images of silica nanotubes according to aspects of the present invention.
Figure 16B:

FIGS. 16A and 16B are transmission electron microscopy (TEM) images which further illustrate the high-quality of the silica nanotube formation. In FIG. 16A the uniform inner diameter is shown, which generally persists along the entire length of the nanotube. The pore sizes for the nanotubes range from about 10 nm to 200 nm, with smooth inner and outer walls.

Nanotube thickness was found to be around 70 nm for a 1000° C. thermal treatment, despite the range of pore sizes for the nanotubes. This result is considered reasonable because the oxidation layer thickness is expected to be the same for the nanowires under a constant thermal treatment condition since the thermal oxidation of the silicon is a self-limiting process. The self-limitation of the process can be taken advantage of for controlling tube size and wall thickness by adjusting the characteristics of the thermal treatment process, such as the treatment temperature.

As an example of how nanotube characteristics can be controlled, a sample oxidized at 900° C. has a typical wall thickness of around 55–65 nm, while a temperature of about 800° C. yields a wall thickness of around 30–35 nm. The nanotube shown in FIG. 16B has a pore size of approximately 20 nm, however as can be seen, it still is uniform and has a smooth inner wall. Occasionally branched nanotubes were produced, it should be appreciated that these nanotubes will provide benefits for select nanofluidic and electronic applications.

This multiuse approach of making silica nanotube array templates from silicon nanowire arrays is a well-controlled process capable of controlling the pore size and the array height, while the resultant nanotubes can be readily subjected to different surface modification on inner and outer walls. The respective surface modification of inner and outer walls can be important in applications such as bioseparation and smart molecule transport. In addition, the walls of these nanotubes are formed from pinhole-free condensed thermal oxide, which can be advantageous in terms of its mechanical robustness and fluidic stability.

Consequently, this new class of semiconductor nanotubes represented by the present invention is mechanically robust, electrically and optically active. Therefore, these nanotubes could offer additional opportunities for further fundamental research as well as technological applications in nanocapillary electrophoresis, nanofluidic biochemical sensing, nanoscale electronics and optoelectronics (see Schoening, M & Poghossian, A. Recent advances in biologically sensitive field-effect transistors (BioFETs), *Analyst*, 127, 1137–1151 (2002), incorporated herein by reference). It should be appreciated that the successful preparation of single-crystalline GaN nanotubes using this "epitaxial casting" approach suggests that it is generally possible to prepare single-crystalline nanotubes of inorganic solids that have non-layered crystal structures (see Lauhon, L. J., Gudiksen, M. S., Wang, D. & Lieber, C. M. Epitaxial core-shell and core-multishell nanowire heterostructures. *Nature*, 420, 57–61 (2002); and He, R., Law, M., Fan, R., Kim, F. & Yang, P. Functional bimorph composite nanotapes, *Nano. Lett.* 2, 1109–1112 (2002), the preceding incorporated herein by reference).

It should also be appreciated that the techniques described herein may be further extended by forming multiple sheath layers. Each of these sheath layers may comprise different materials, different doping constituents or levels. Still further, longitudinal portions (segments) of the nanotube may be differentially processed to yield different properties between segments of the nanotube structure, or multilayer nanotube structure. The following nanotubular structure are provided by way of example and not by way of limitation.

Figure 17:
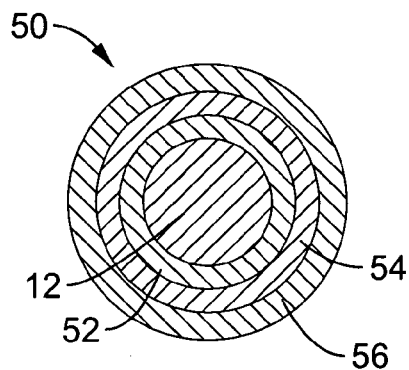
FIG. 17 is a cross-section of a multilayer nanotube according to an aspect of the present invention and shown with a gallium nitride sheath sandwiched between insulating aluminum nitride layers.

FIG. 17 depicts a multilayer nanotube 50 comprising a sacrificial ZnO nanowire 12 (prior to removal) over which a gallium nitride (GaN) sheath 54 is held between two sheaths 52, 56 of aluminum nitride (AlN). It will be appreciated that the sacrificial nanowire may be removed at any time after at least the first sheath layer has been deposited over the nanowire, and it could be removed subsequent to depositing the last sheath layer.

Figure 18:
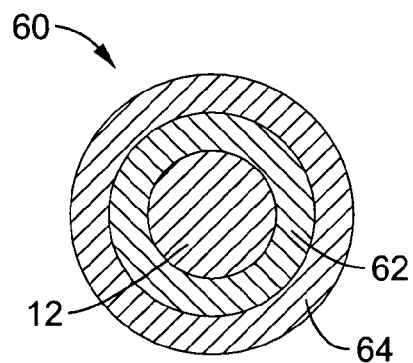
FIG. 18 is a cross-section of a multilayer nanotube according to an aspect of the present invention and shown with a P-doped sheath over an N-doped sheath which surrounds the sacrificial core.
Figure 19:
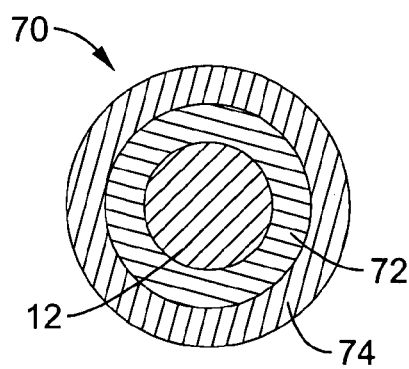
FIG. 19 is a cross-section of a multilayer nanotube according to an aspect of the present invention and shown with an N-doped sheath over a P-doped sheath which surrounds the sacrificial core.

FIG. 18 and FIG. 19 depict forming sheaths of alternately doped material 60. FIG. 18 showing P-doped GaN 62 over a sacrificial core 12 (prior to removal), such as ZnO, and N-doped GaN material 64 over the P-doped material. Similarly, FIG. 19 illustrates the converse of FIG. 18 with P-doped material 74 over N-doped material 72 which sheaths core 12 (prior to its removal). It should be appreciated that from the present methods numerous circuits may be fabricated, including diodes, light emitters, light detectors, electron transport devices (i.e. bipolar transistors, FETs, insulated gate FETs, and so forth) and combinations thereof. Connection to device layers can be provided from the core, or external circumferential connections, while connections may also be embedded into the material layers. The above process methodology may be continued for producing any desired number of nested sheaths within a given nanotube.

Figure 20:
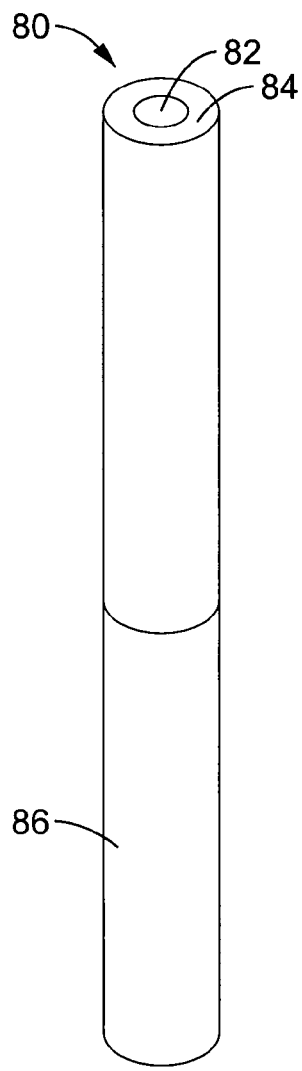
FIG. 20 is a perspective view of a sacrificial core covered with a solid sheath and having two longitudinal nanotube segments according to an aspect of the present invention.
Figure 21:
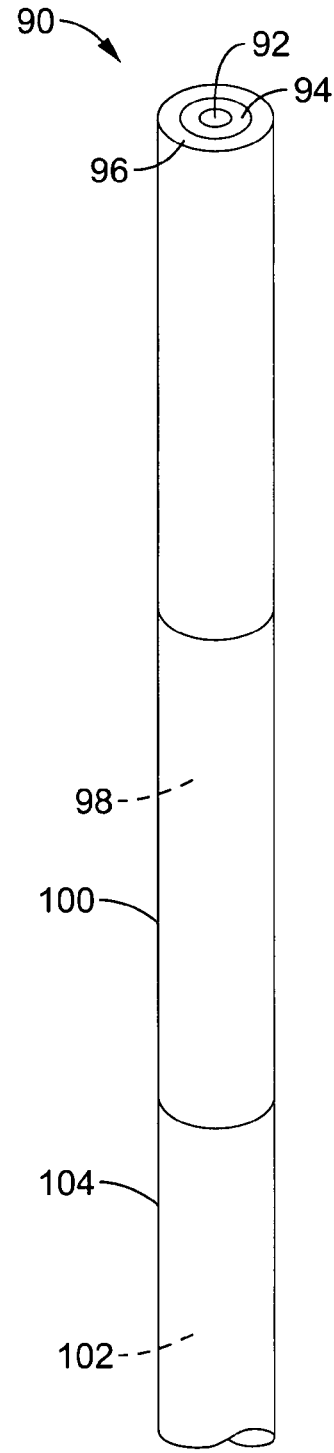
FIG. 21 is a perspective view of a sacrificial core covered with multiple sheaths and having multiple longitudinal nanotube segments according to an aspect of the present invention.

FIG. 20 and FIG. 21 depict forming segmented nanotube sheaths by the present invention, wherein the different segments are formed from different materials, different dopants, different levels of doping, or combinations thereof. These sheaths may be fabricated segment-by-segment in any convenient manner, such as utilizing conventional masking techniques.

In FIG. 20 a nanotube 80 is depicted having two segments of different sheath material 84, 86 disposed longitudinally over a sacrificial core 82. FIG. 21 depicts a nanotube 90 formed from three or more longitudinal segments of different material, differently doped material, or material that is otherwise configured to provide different properties. Furthermore, the nanotube is shown having at least two sheaths of material.

A core 92 is shown prior to removal, with an upper-inner sheath 94, an upper-outer sheath 96, a middle-inner sheath 98, a middle-outer sheath 100, a lower-inner sheath 102, and a lower-outer sheath 104. It should be recognized that any desired number of sheath layers may be deposited and that nanotube may be fabricated with any number of longitudinal segments. It should also be appreciated that insulators and electrical connections on the sheath layers may be formed as portions of different sheath segments. Furthermore, the removed core of the nanotube may be utilized as a fluid via, or lined with material, such as metal, to form another layer (i.e. conductive contact layer).

Figure 22:
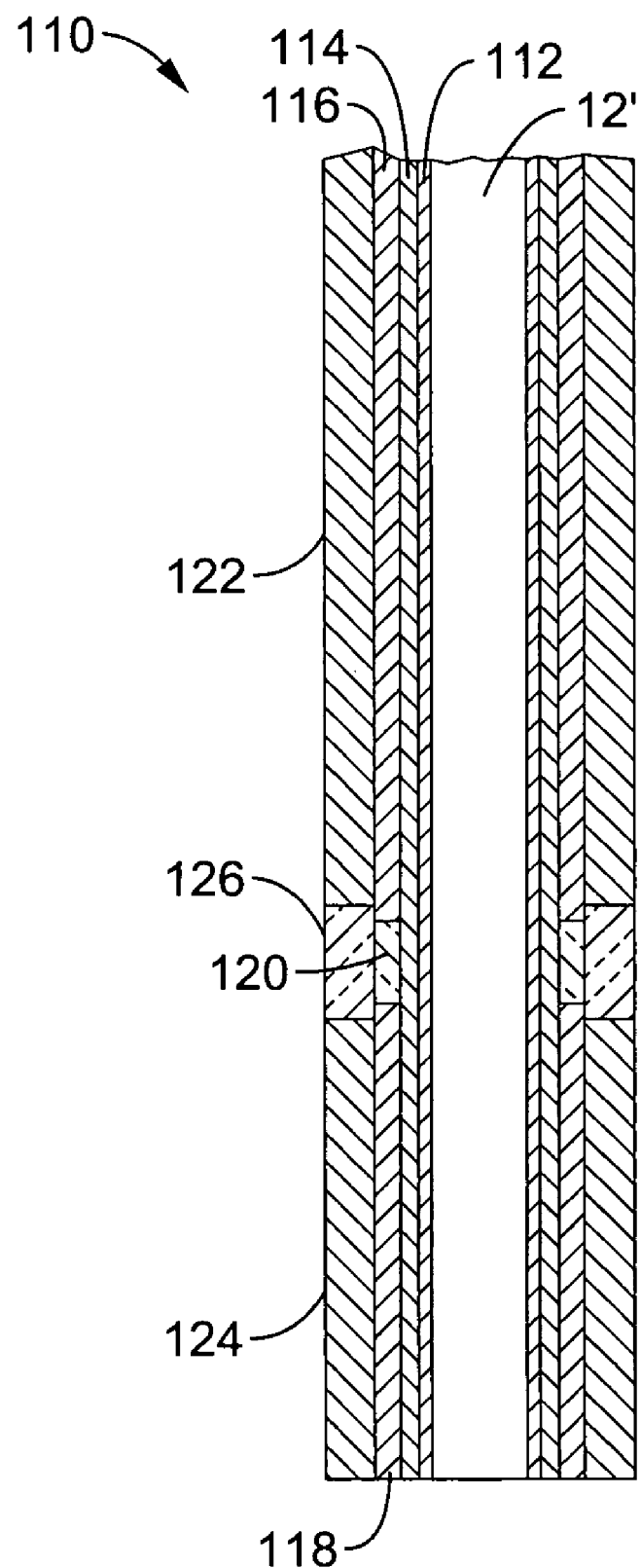
FIG. 22 is a cross-section of fabricating a nanotubular device according to an aspect of the present invention, shown comprising a hollow core NPN transistor.

FIG. 22 illustrates by way of example a cross-section of a nested sheath of layers 110 forming a bipolar transistor. A hollow 12' represents from where the sacrificial nanowire core was removed. The interior of hollow 12' is shown lined as a metallic contact 112. Three sheaths are shown in the figure. A P-doped semiconducting inner sheath 114 is shown. Separated middle sheaths of N-doped semiconductor 116, 118, are depicted between which a central insulating ring 120 is shown surrounding inner sheath 114. Finally a conductive outer sheath is shown with upper conductor 122 and lower conductor 124 separated by insulating sheath segment 126. It will be appreciated that the simple example depicts a form of bipolar NPN transistor along the nanotube length, having exterior emitter contact 122 and collector contact 124 and a base contact 112 lining hollow core 12'. The thickness of the layers may be varied to achieve desired electrical properties, or to enhance rigidity such as provided by the external sheath segments 122, 124, 126.

The transistor is provided by way of example and a wide assortment of devices may be fabricated according to the techniques of the present invention. It should be appreciated that various material and electrical properties may be achieved utilizing the methods of the present invention. Furthermore, various electronic devices, such as diodes, light emitting diodes, lasers, transistors, field effect transistors, and so forth may be produced in accord with the teachings of the present invention.

As can be seen, therefore, the present invention comprises a method of fabricating nanotubes by forming a sheath over a sacrificial core, and then removing the core. Two general methods were described: (i) epitaxial casting and (ii) oxidation and etching. Furthermore, examples of specific nanotube structures were described, such as a GaN nanotube (over a ZnO sheath) using the epitaxial casting method and a $SiO_2$ nanotube (over a Si sheath) using the oxidation and etching method. However, other materials can be used including, without limitation. GaN, Ge, Ag, group II–VI, III–V, elemental group IV (e.g., Si, Ge), and metals as core materials, and further, including without limitation, group II–VI, II–V, elemental group IV, metals, oxides of the above, and polymers as sheath materials. Note also that all of the sheaths can be doped during formation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for fabricating a nanotube, comprising:
   forming a nanowire;
   depositing at least one sheath of material over said nanowire; and
   removing said nanowire;
   wherein said remaining sheath material comprises said nanotube; and
   wherein said nanotube is formed as an epitaxial casting.

2. A method as recited in claim 1,
   wherein said nanotube is formed from a single-crystalline sheath structure.

3. A method as recited in claim 1 or 2, wherein said nanowire comprises a material selected from the group of materials consisting essentially of zinc oxide (ZnO), silicon (Si), gallium nitride (GaN), germanium (Ge), silver (Ag), gold (Au), group II–VI materials, group III–V materials, elemental group IV materials, and metals.

4. A method as recited in claim 3, wherein said sheath comprises a material selected from the group of materials consisting of gallium nitride (GaN), silicon oxide ($SiO_2$), group II–VI materials, group III–V materials, elemental group IV, metals, oxides of the preceding materials, dopants introduced in the preceding materials, and polymers.

5. A method for fabricating a nanotube, comprising:
   forming a nanowire;
   depositing at least one sheath of material over said nanowire; and
   removing said nanowire;
   wherein said remaining sheath material comprises said nanotube;
   wherein said nanowire comprises a material selected from the group of materials consisting essentially of zinc oxide (ZnO), silicon (Si), gallium nitride (GaN), germanium (Ge), silver (Ag), gold (Au), group II–VI materials, group III–V materials, elemental group IV materials, and metals;
   wherein said sheath comprises a material selected from the group of materials consisting of gallium nitride (GaN), silicon oxide ($SiO_2$), group II–VI materials, group III–V materials, elemental group IV, metals, oxides of the preceding materials, dopants introduced in the preceding materials, and polymers; and
   wherein the material selected for said nanotube sheath has a sufficiently similar crystalline structure and lattice constant as the material selected for said nanowire to allow epitaxial growth of said sheath on said nanowire.

6. A method as recited in claim 1, 2 or 5, wherein said nanowire is sacrificed during said removal step.

7. A method as recited in claim 1, 2 or 5, wherein said nanowire comprises a sacrificial template for forming said nanotube.

8. A method as recited in claim 1, 2 or 5, wherein said sheath comprises a single longitudinal segment covering said nanowire.

9. A method as recited in claim 1, 2 or 5, wherein said sheath comprises multiple longitudinal segments covering said nanowire.

10. A method as recited in claim 9, wherein said multiple longitudinal segments are formed utilizing masking techniques.

11. A method as recited in claim 1, 2 or 5;
    wherein an array of said nanotubes is fabricated by depositing sheaths over an array of nanowires;
    wherein said array is formed upon a substrate.

12. A method for fabricating a nanotube, comprising:
    forming a sacrificial nanowire template of zinc oxide (ZnO);
    depositing at least one sheath of gallium nitride (GaN) over said nanowire; and removing said nanowire;

wherein said sheath comprises a single-crystalline gallium nitride (GaN) nanotube structure;

wherein said gallium nitride (GaN) sheath is deposited over said nanowire by epitaxial casting.

13. A method as recited in claim 12, wherein said nanowire comprises single-crystalline zinc oxide (ZnO).

14. A method as recited in claim 12, wherein said epitaxial casting comprises gallium nitride (GaN) chemical vapor deposition.

15. A method as recited in claim 14:

wherein trimethylgallium and ammonia are used as precursors to said chemical vapor deposition and is fed with argon or nitrogen carrier gas;

wherein said chemical vapor deposition of GaN is performed at approximately six hundred degrees Celsius (600° C.) to seven hundred degrees Celsius (700° C.).

16. A method as recited in claim 12:

wherein said gallium nitride (GaN) nanotube has an inner diameter which is in the range from approximately thirty (30 nm) nanometers to two hundred (200 nm) nanometers;

wherein said gallium nitride (GaN) nanotube has a wall thickness which is in the range from approximately five (5 nm) nanometers to fifty (50 nm) nanometers.

17. A method as recited in claim 12, wherein said nanowire of zinc oxide (ZnO) is removed by subjecting it to elevated temperature in an atmosphere containing hydrogen gas.

18. A method as recited in claim 17:

wherein said elevated temperature comprises approximately six hundred degrees Celsius (600° C.);

wherein said atmosphere comprises approximately ten percent (10%) hydrogen gas in an argon gas atmosphere.

19. A method as recited in claim 12, wherein said nanowire of zinc oxide (ZnO) is removed by subjecting said array to chemical etching.

20. A method as recited in claim 19, wherein said chemical etching comprises ammonia etching at sufficiently elevated temperature for removal of said zinc oxide nanowire.

21. A method for fabricating a nanotube, comprising:

forming a sacrificial nanowire template of a first material;

forming a sheath of modified said first material over said nanowire; and removing said nanowire;

wherein said sheath is a nanotube structure; and wherein said nanowire and said sheath comprise a single-crystalline material;

wherein said sheath comprises an epitaxial casting.

22. A method as recited in claim 21, wherein said sheath is formed on said nanowire by thermal oxidation.

23. A method as recited in claim 21, wherein said nanowire is removed in an etching process.

24. A method as recited in claim 21:

wherein said first material comprises silicon (Si);

wherein said modified first material comprises silicon oxide ($SiO_2$).

25. A method as recited in claim 24, wherein said sheath is formed on said nanowire by a thermal oxidation process in which temperature determines the thickness of said sheath.

26. A method as recited in claim 25, wherein the temperature of said thermal oxidation is in the range of from approximately eight hundred degrees Celsius (800° C.) to approximately one thousand degrees Celsius (1000° C.).

27. A method for fabricating a nanotube, comprising:

forming a sacrificial nanowire template of a first material;

forming a sheath of modified said first material over said nanowire; and removing said nanowire;

wherein said sheath is a nanotube structure wherein said sheath comprises an epitaxial casting;

wherein said first material comprises silicon (Si);

wherein said modified first material comprises silicon oxide ($SiO_2$);

wherein said sheath is formed on said nanowire by a thermal oxidation process in which temperature determines the thickness of said sheath;

wherein the temperature of said thermal oxidation is in the range of from approximately eight hundred degrees Celsius (800° C.) to approximately one thousand degrees Celsius (1000° C.); and wherein said nanowire is removed in an etching process comprising:

covering the combination of said sheath and nanowire with an etch-resistant material;

removing the top end of the sheathed nanowire while the sheathed walls of said nanotube are protected by said etch-resistant material;

removing the silicon (Si) nanowire material from within said silicone oxide ($SiO_2$) nanotube; and removing said etch-resistant material.

28. A method as recited in claim 27, wherein said etch-resistant material comprises a dimer or polymer.

29. A method as recited in claim 28, wherein said etch-resistant material comprises perylene.

30. A method as recited in claim 27, wherein said removing the top end of said sheathed nanowire comprises:

etching in oxygen plasma to remove sufficient depth of said etch-resistant material to expose said sheathed nanowires; and etching in hydrofluoric acid to remove the metal cap of said nanowire.

31. A method as recited in claim 30, wherein said removal of the silicon (Si) nanowire comprises etching in xenon fluorine ($XeF_2$).

32. A method as recited in claim 27, wherein removal of said etch resistant material comprises oxygen plasma etching.

33. A method as recited in 1, 2, or 21, wherein said sheath is formed having a plurality of layers.

34. A method as recited in 33, wherein each of the plurality of said sheath layers is formed comprises one or more of: different materials, different doping constituents, or different doping layers.

* * * * *